United States Patent
Seo

(10) Patent No.: US 7,141,313 B2
(45) Date of Patent: *Nov. 28, 2006

(54) LIGHT EMITTING DEVICE

(75) Inventor: Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/134,320

(22) Filed: May 23, 2005

(65) Prior Publication Data

US 2005/0208336 A1    Sep. 22, 2005

Related U.S. Application Data

(63) Continuation of application No. 10/894,431, filed on Jul. 20, 2004, now Pat. No. 6,901,144, which is a continuation of application No. 09/997,173, filed on Nov. 30, 2001, now Pat. No. 6,764,776.

(30) Foreign Application Priority Data

Nov. 30, 2000   (JP)   ............... 2000-366045

(51) Int. Cl.
  H05B 33/14   (2006.01)
  H01L 51/50   (2006.01)
(52) U.S. Cl. ............ 428/690; 428/917; 313/504; 313/506; 257/102; 257/103
(58) Field of Classification Search ............ 428/690, 428/917; 313/504, 506; 257/102, 103
See application file for complete search history.

(56) References Cited

U.S. PATENT DOCUMENTS

| 5,100,587 | A |   | 3/1992 | Clough et al. |
| 6,495,644 | B1 | * | 12/2002 | Chen et al. ............. 526/258 |
| 6,764,776 | B1 | * | 7/2004 | Seo ........................ 428/690 |
| 6,901,144 | B1 | * | 5/2005 | Seo ........................ 379/433.04 |

FOREIGN PATENT DOCUMENTS

JP    10-045722    2/1998

OTHER PUBLICATIONS

Daisuke Yoshioka; "Zinc(II) Carboxylate Complex Having The Absorption Ability Which Exceeds That Of Zeolite"; *Chemical Society of Japan*, vol. 53, No. 11; p. 1332; 2000 & English Translation.

C.W. Tang, et al., "Organic Electroluminescent diodes", *Applied Physics Letter*, vol. 51, No. 12, pp. 913-915 (1987).

T. Tsutsui, "The Operation Mechanism And The Light Emission Efficiency Of The Organic EL Element", *English Translation of Molecular Electronics and Bioelectronics* (in Japanese), pp. 31-37 (1993).

D. F. O'Brien et al., "Improved energy transfer in electrophosphorescent devices", *Applied Physics Letters*, vol. 74, No. 3, 442-444 (1999).

T. Tsutsui et al., "High Quantum Efficiency in Organic Light-Emitting Devices with Indium-Complex as a Triplet Emissive Center", *Japanese Jour. of Appl. Phy.*, vol. 38, L1502-L1504 (1999).

V. Ramamurthy et al., "Heavy-Atom-Induced Phosphorescence of Aromatics and Olefins Included within Zeolites", *Journal of American Chemical Society*, vol. 114, No. 10, 3882-3892 (1992).

S. Takamizawa, "Metal Complexes Capable of Occluding Molecules", *English translation of Chemical Society of Japan* (in Japanese), vol. 53-2, pp. 136-139 (2000).

W. Mori, et al., "New Microporous Materials", *English translation of Chemical Society of Japan* (in Japanese), vol. 51-2, pp. 210-212 (1998).

H. Nishiguchi et al., "Enhancement Of The Phosphorescence Yields Of Xanthone Included In Alkali-Metal-Cation-Exchanged Zeolites—External Heavy-Atom Effect On The Singlet-Triplet Transitions", *J. Photochem. Photobiol. A: Chem.*, vol. 77, pp. 183-188 (1994).

Tao et al.; "Blue photoluminescent zinc coordination polymers with supertetranuclear cores"; *Chemical Communications*; pp. 2043-2044 (2000).

Wuji Huaxue Xuebao; *Chinese Journal of Inorganic Chemistry* 15 (3); pp. 305-309; 1999.

Chun-ying Xian et al.; "Synthesis and Characterization of Quaternary Mixed Complexes"; *Huaxue Shijie* 42(7); pp. 342-345 (2001).

Yingyong Huaxue; *Chinese Journal of Applied Chemistry* 6(2); pp. 23-29 (1989).

* cited by examiner

*Primary Examiner*—Dawn Garrett
(74) *Attorney, Agent, or Firm*—Fish & Richardson P.C.

(57) ABSTRACT

There are provided a light emitting device and an electronic device, which are light, have low consumption power and a low cost. When an organic light emitting material (1204b) is included in the positions between the lattices of a heavy metal complex (1204a) with a lattice structure, the phosphorescence of the organic light emitting material (1204b) in which only fluorescence is generally observed can be promoted. Since the organic EL element obtained thus can utilize phosphorescence, the light emission efficiency is high. Also, since a conventional organic light emitting material can be used, various light emission colors are obtained and the organic EL element can be manufactured at a low cost. A light emitting device and an electronic device are manufactured using such an organic EL element.

26 Claims, 19 Drawing Sheets

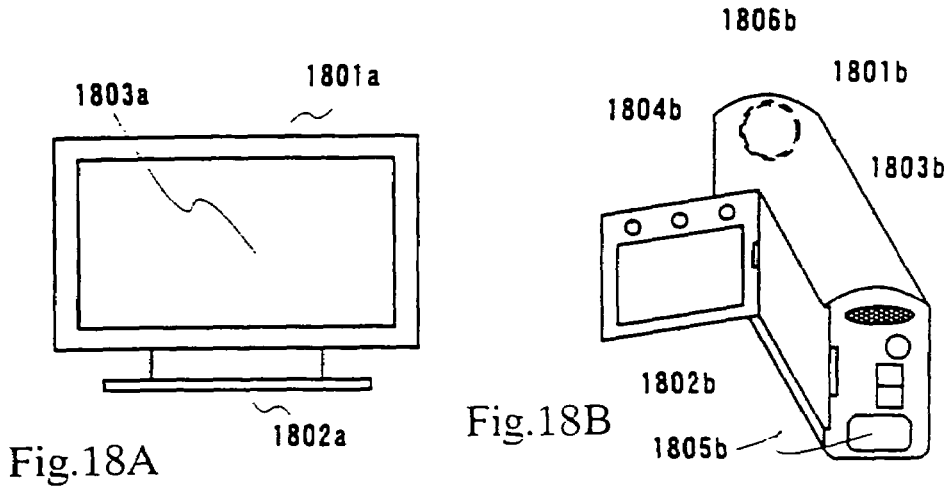
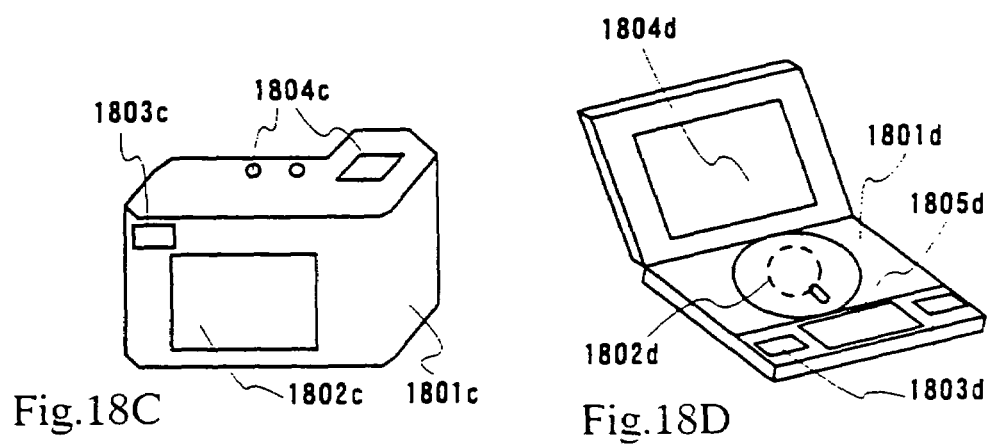
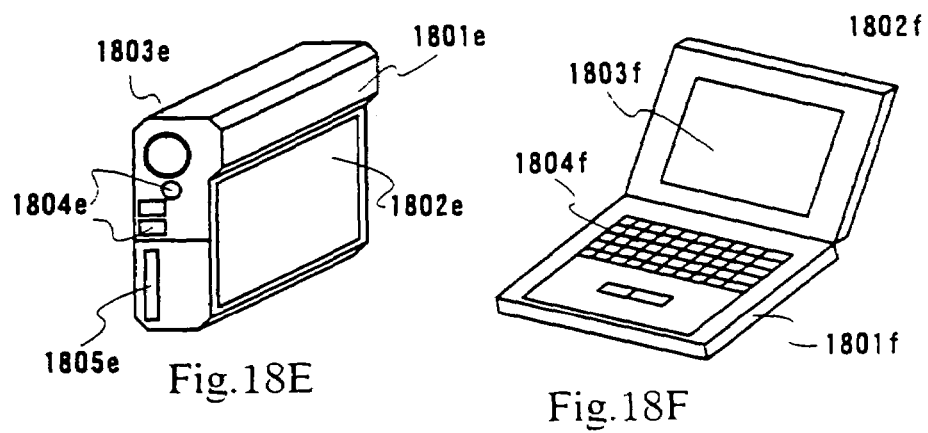
Fig.18A Fig.18B Fig.18C Fig.18D Fig.18E Fig.18F

LIGHT EMITTING DEVICE

CROSS-REFERENCE TO RELATED APPLICATIONS

This application is a continuation application of U.S. application Ser. No. 10/894,431, filed Jul. 20, 2004, now U.S. Pat. No. 6,901,144, which is a continuation of U.S. application Ser. No. 09/997,173, filed Nov. 30, 2001, now U.S. Pat. No. 6,764,776, which claims the benefit of a foreign priority application filed in Japan as Serial No. 2000-366045 on Nov. 30, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a light emitting device using an element (hereinafter referred to as "an organic EL element") which has an anode layer, a cathode layer, and a film (hereinafter referred to as "an organic EL layer") including an organic compound in which an EL (electro luminescence: luminescence produced by applying an electric field) is produced. As the EL in the organic compound, there are light emission (fluorescence) generated in returning from a singlet excitation state to a ground state and light emission (phosphorescence) generated in returning from a triplet excitation state to a ground state. The present invention particularly relates to a light emitting device in which a metal complex, which is capable of forming pores due to a two dimensional or a three dimensional mesh structure, is applied to a light emitting layer and thus light emitting materials are arranged in the pores to promote light emission of phosphorescence. Note that a light emitting device in this specification indicates an image display device or a light emitting device using an organic EL element as a light emitting element. Also, a module in which a TAB (tape automated bonding) tape or a TCP (tape carrier package) is attached to the organic EL element, a module in which a printed wiring board is provided in the end of the TAB tape or the TCP, and a module in which an IC (integrated circuit) is directly mounted on the organic EL element by a COG (chip on glass) method are all included in the light emitting device.

2. Description of the Related Art

An organic EL element is an element which emits light by applying an electric field thereto. According its light emitting mechanism, a voltage is applied to an organic EL layer sandwiched between electrodes and thus an electron injected from a cathode and a hole injected from an anode are recombined in a light emitting center of the organic EL layer to form a molecule with an excitation state (hereinafter referred to as "a molecular exciton") and the molecular exciton releases energy to emit light in returning to a ground state.

In the general organic EL element, the organic EL layer is made from a thin film which is thinner than 1 μm. Also, since the organic EL element itself is a self light emission type, a back light as used in a conventional liquid crystal display is not required. Therefore, it is a great advantage that the organic EL element is manufactured to be extremely thin and light weight.

Also, in the case of the organic EL layer with, for example, about 100 to 200 nm, when the carrier mobility of the organic EL layer is considered, a period from the injection of carriers to the recombination is about several tens of nanoseconds. Even if a process from the recombination to the light emission is included in the period, light emission is carried out within an order of microseconds. Therefore, a very high response speed is one of the characteristics.

Further, since the organic EL element is a carrier injection type light emitting element, it can be driven by a direct current voltage and a noise is hard to cause. With respect to a drive voltage, drive is allowed at an order of several volts by a method of selecting an electrode material in which a carrier injection barrier is lowered, a method of introducing a heterostructure (laminate structure), or the like (Reference 1: C. W. Tang and S. A. VanSlyke. "Organic electroluminescent diodes". Applied Physics Letters, vol. 51 No. 12. 913–915 (1987)). In Reference 1, an alloy of Mg:Ag is used as a cathode and a hetero structure in which a diamine compound and tris(8-quinolinolato)aluminum (hereinafter referred to as "$Alq_3$") are laminated is used, and thus direct current low voltage drive is realized.

Because of the above characteristics such as a thin type, light weight, fast response, and direct current low voltage drive, the organic EL element attracts an attention as a next generation flat panel display element. Also, the organic EL element is a self light emission type and has a wide view angle. Thus, its visibility is relatively high and it is considered that the organic EL element is effective as an element used for a display screen of mobile equipment.

Here, as described above, the organic EL is a phenomenon in which light is emitted when the molecular exciton is returned to the ground state, and a singlet excitation state ($S^*$) and a triplet excitation state ($T^*$) are allowed as the excitation state of the molecular exciton produced by the organic compound. Also, it is considered that the statistical Generation ratio in the organic EL element is $S^*:T^*=1:3$ (Reference 2: Tetsuo Tsutsui. "The Japan Society of Applied Physics, Organic Molecule and Bioelectronics Division, Third Seminar Text", p.31 (1993)).

However, with respect to a general organic compound, light emission (phosphorescence) from the triplet excitation state ($T^*$) is not observed at a room temperature and only light emission (fluorescence) from the singlet excitation state ($S^*$) is generally observed. This is because the around state of the organic compound is generally the singlet excitation state (So) and thus a transition $T^*$—So becomes a forbidden transition and a transition $S^*$—So becomes an allowed transition.

That is, only the singlet excitation state ($S^*$) generally contributes light emission and this is the same in the case of the organic EL element. Thus, it is assumed that a theoretical limitation of internal quantum efficiency (ratio of photons generated to injected carriers) in the organic EL element is 25% based on evidence of $S^*:T^*=1:3$.

Also, all generated light is not emitted to the outside and a part of the light cannot be picked up due to refractive indexes which are inherent to organic EL element constituent materials (organic EL layer material and electrode material) and a substrate material. A ratio of the light picked up toward the outside to the generated light is called light pickup efficiency. It is said that the pickup efficiency in the organic EL element which has a glass substrate is about 20%.

From the above reason, even if all the injected carriers form the molecular excitons, it is said that the theoretical limitation of a ratio of photons finally picked up toward the outside to the number of injected carriers (hereinafter referred to as "external quantum efficiency") is 25%×20%=5%. That is, even if all carriers are recombined, only 5% of the recombined carriers are picked up as light according to calculation.

However, recently, organic EL elements, which are capable of converting energy released in returning from a triplet excitation state (T*) to a ground state (hereinafter referred to as "triplet excitation energy") into light to be emitted, are successively reported and their high light emission efficiencies are noted (Reference 3: D. F. O'Brien, M. A. Baldo. M. E. Thompson and S. R. Forrest, "improved energy transfer in electrophosphorescent devices". Applied Physics Letters, Vol. 74, No. 3 442–444 (1999) and Reference 4: Tetsuo Tsutsui, Moon-Jae Yang, Masayuki Yahiro, Kenji Nakamura, Teruichi Watanabe, Taishi Tsuji, Yoshinori Fukuda, Takeo Wakimoto and Satoshi Miyaguchi. "High Quantum Efficiency in Organic Light-Emitting Devices with Iridium-Complex as a Triplet Emissive Center." Japanese Journal of Applied Physics. Vol. 38. L1502–L1504 (1999)).

In Reference 3, a metal complex with platinum as main metal (hereinafter referred to as "a platinum complex") is used. Also, in Reference 4, a metal complex with iridium as main metal (hereinafter referred to as "an iridium complex") is used. Thus, it can be said that it is a characteristic to introduce a third transition series element as main metal in any metal complex. There is an organic EL element in which the theoretical limitation value of the external quantum efficiency as described above greatly exceeds 5%.

As described in References 3 and 4, with respect to the organic EL element which is capable of converting the triplet excitation energy into light to be emitted, higher external quantum efficiency than a conventional element can be achieved. And, if the external quantum efficiency is increased, a light emission intensity is improved. Thus, it is considered that the organic EL element, which is capable of converting the triplet excitation energy into light to be emitted, has a large share in future developments as a manner for achieving high intensity light emission and high light emission efficiency.

However, since both platinum and iridium are so-called noble metal, the platinum complex and the iridium complex using these metals are expensive and thus it is expected that a cost reduction is hindered in future.

In addition, a color of light which the above iridium complex emits is a green color, that is, a wavelength located in the middle of a visible light region. When the platinum complex is used as a dopant, it emits light of a red color with a relatively high color purity. However, there are the following defects. That is, in the case of the platinum complex with a low concentration, a color purity is decreased since a host material also emits light. In the case of a high concentration, light emission efficiency is reduced because of concentration quench. In other words, high efficiency light emission of a red color and a blue color, which have a high color purity is not obtained from the organic EL element which is capable of converting the triplet excitation energy into light to be emitted.

Therefore, when it is considered that a full color flat panel display is manufactured using light emission colors of red, green, and blue in the future, it is necessary to achieve red color light emission and blue color light emission, which have high external quantum efficiency and a high color purity in the cases of the iridium complex and the platinum complex, using a lower cost material as much as possible.

From such a background, it is desirable that the organic EL element which is capable of converting the triplet excitation energy into light to be emitted, except the organic EL element using the iridium complex or the platinum complex, which already exists, is developed. A most simple method is developing a new organic compound in which light is emitted as phosphorescence at a room temperature. However, a clear molecular design plan is not established until now and is very difficult in many aspects.

Thus, although it is important to develop a new material which emits phosphorescence light, a method of designing a structure of the organic EL layer, in which phosphorescence light emission is promoted, is desirable for light emitting materials used in a conventional organic EL element. This reason is as follows. That is, since various light emission colors have been already obtained in the case of the light emitting materials used in the conventional organic EL element, there is a possibility that various light emission colors are obtained and a large number of low cost materials are present.

SUMMARY OF THE INVENTION

Therefore, an object of the present invention is to obtain an organic EL element which is capable of converting triplet excitation energy into light to be emitted by devising a structure of a light emitting layer with using a light emitting material used in a conventional organic EL element. Thus, an object of the present invention is to provide an organic EL element which has high light emission efficiency, indicates various light emission colors by using a conventional organic compound, and can be manufactured at a low cost.

Also, an object of the present invention is to provide a light emitting device at a low cost, which is light, has low consumption power, and indicates various light emission colors, using an organic EL element disclosed by the present invention. Further, an object of the present invention is to provide an electronic device which is light, has low consumption power, indicates various light emission colors, and which has a low cost by using such a light emitting device.

The present inventor focused attention on a heavy atom effect which is known in the field of PL (photo luminescence: luminescence produced by light irradiation). The heavy atom effect is that spin-orbit interaction is increased and light emission of phosphorescence is promoted when a heavy atom (atom which has a large number of atomic nucleus loads) is introduced into a molecular or a solvent. Note that the atomic nucleus load corresponds to an atomic number, that is, the number of positive electric charge of an atomic nucleus.

The heavy atom effect includes two types, that is, an internal heavy atom effect and an external heavy atom effect. The internal heavy atom effect is that light emission of phosphorescence is promoted in the case where a heavy atom is included in a molecular of a light emitting material. On the other hand, even when a heavy atom is present in a solvent containing a light emitting material as a solute, there is the case where the promotion of phosphorescence light emission of the light emitting material is observed. This phenomenon is called the external heavy atom effect.

Thus, if the external heavy atom effect can be produced even in the organic EL element, it is considered that there is a possibility of generating phosphorescence. That is, this is a method of locating a material including a heavy atom near the light emitting material to promote the phosphorescence light emission.

Simply, although a method of dispersing metal as a heavy atom into the light emitting layer of an organic EL layer is considered, it is hard to function as the light emitting layer in this case. For example, when alkali metal (such as cesium)

is doped into the organic EL layer, the electrical conductivity of the doped layer is improved and the layer can exert a superior function as a carrier transport layer. However, since the doped metal becomes a material for deactivating excitation energy to suppress light emission (hereinafter referred to as "a quencher"), the doped layer does not emit light. Therefore, it is generally difficult to use the doped layer as the light emitting layer and the introduction of the heavy atom effect becomes impossible.

Thus, it is essential that not metal itself but an insulator including a heavy atom is located near the light emitting material. That is, when an insulator with a large band gap is used as a material including the heavy atom, energy transfer from the light emitting material and deactivation are suppressed and it is prevented that the material becomes a quencher. Therefore, the promotion of the phosphorescence light emission by the heavy atom effect can he expected.

For example, there is a report with respect to PL characteristic of an organic material which is dispersed into pores of zeolite which is an insulator (Reference 5: V. Ramamurthy, J. V. Caspar, D. F. Eaton, Erica W. Kuo, and D. R. Corbin. "Heavy-Atom-Induced Phosphorescence of Aromatics and Olefins Included within Zeolites", Journal of American Chemical Society, Vol. 114, No. 10, 3882–3892 (1992)). According to Reference 5, with respect to the PL of the organic material included in the pores of the zeolite, when cations (Li, Na, K, Rb, Cs, and TI) of the zeolite are substituted in succession, the phosphorescence light emission is promoted by the heavy atom effect as the cation becomes a heavier atom is obtained.

Here, in particular, the present inventor considers that a method of using the insulator including the heavy atom in a form of a porous body (in which a distribution of a pore size is uniform if possible) and introducing the light emitting material to the insides of the pores of the porous body is desirable as in Reference 5. This is because a structure in which the light emitting material is surrounded by the porous body is obtained, and thus it is expected that the interaction between the heavy atom included in the porous body and the light emitting material is increased and the promotion of phosphorescence light emission by the heavy atom effect is easy to be produced. Also, since the light emitting material is trapped in the pores and the pores are systematically arranged, this becomes a state in which a pseudo superlattice structure and thus there is a possibility that a stable molecular exciton is produced and the improvement of a light emitting characteristic is led.

Note that there are several problems in the case where the light emitting material is included in the zeolite to drive the organic EL element. First, when the zeolite is provided on an electrode, there is a possibility that the injection of carrier into the organic EL layer is prevented and the light emitting characteristic is deteriorated. Also, a technique for forming the zeolite as a thin film with a thickness of about 100 to 200 nm is required. Further, in the case of vacuum evaporation, the light emitting material cannot be included in the zeolite (it is allowed in a dry method).

When these problems with respect to an electrical characteristic and a process are considered, it is said that the method of promoting the phosphorescence light emission using the zeolite, as described in Reference 5, is easy because of the PL. That is, it is relatively difficult to apply this method to the EL element.

Thus the present inventor devised a method, in which a concept that the light emitting material is included in the pores of the porous body including the heavy atom is utilized, and which is hard to cause the problems with respect to the electrical characteristic and the process. The method uses a metal complex which has a mesh-shaped structure as a host to the light emitting material and disperses the light emitting material into the mesh of the host. Its schematic view is shown in FIGS. 1A and 1B.

As the mesh formed by the metal complex (hereinafter referred to as merely "a lattice"), a form as shown in FIG. 1A in which metal atoms 101a are located in lattice points and cross-linked through ligands 102a (hereinafter referred to as "a lattice A1") and a form as shown in FIG. 1B in which ligands 102b are located in lattice points and cross-linked through metal atoms 101b (hereinafter referred to as "a lattice B1") are considered. Note that, it is considered that a shape of the lattice is not limited to a quadrangle as shown in FIGS. 1A and 1B and various a polygon (such as a hexagon) can be used. Also, both a two dimensional (plane) structure and a three dimensional (solid) structure can be used for the lattice.

Then, when the metal complex which has such a lattice structure is mixed with light emitting material 103 which has a suitable molecular size at the synthesis or at the film formation, the light emitting material can be introduced in the positions between the lattices of the lattice structure.

Thus, according to the present invention, a light emitting device which has an organic EL element including a light emitting layer made of an organic compound in which an EL is obtained and a metal complex, is characterized in that the metal complex has a lattice structure in which metal atoms and ligands are alternately arranged, and the lattice structure has a structure that the metal atoms are located in lattice points and the lattice points are cross-linked through the ligands (lattice A1).

Also, according to the present invention, a light emitting device which has an organic EL element including a light emitting layer made of an organic compound in which an EL is obtained and a metal complex, is characterized in that the metal complex has a lattice structure in which metal atoms and ligands are alternately arranged, and the lattice structure has a structure that the ligands are located in lattice points and the lattice points are cross-linked through the metal atoms (lattice B1).

Note that, it is considered that most metal atoms can produce the heavy atom effect in different degrees. In the field of PL, the heavy atom effect is clearly produced in the case where the metal complex includes an atom with a weight equal to ro larger than particularly bromine (Br: atomic number is 35). Therefore, a metal atom which is heavier than rubidium (Rb: atomic number is 37) is preferable as a metal atom included in the metal complex.

Thus, according to the present invention, a light emitting device which has an organic EL element including a light emitting layer made of an organic compound in which an EL is obtained and a metal complex, is characterized in that the metal complex has a lattice structure of the lattice A1 or the lattice B1, in which metal atoms and ligands are alternately arranged and the metal atoms have an atomic number equal to or larger than rubidium.

Note that, the heavy atom effect is that a heavy atom is introduced to increase spin-orbit interaction and to promote phosphorescence light emission. Thus, even in the case where the heavy atom is not used, the triplet excitation energy can be converted into light to be emitted if a molecular structure, with large spin-orbit interaction can be introduced.

As one method, it is considered to introduce a molecular structure indicating ferromagnetism or antiferromagnetism. Thus, the present inventor noted a dinuclear complex (metal complex which has two metal atoms as nuclei). This is because ferromagnetic or antiferromagnetic interaction is often observed in the dinuclear complex including a paramagnetism metal ion. When heavy metal is selected as the metal atom, the phosphorescence light emission can be further promoted since the heavy atom effect is also added.

Thus, particularly, a metal complex, in which the metal atom shown in FIGS. 1A and 1B substitutes for a dinuclear structure composed of two metal atoms (FIGS. 2A and 2B), is more preferable. In this case, a form as shown in FIG. 2A in which sites 201a with the dinuclear structure are located in lattice points and cross-linked through ligands 202a (hereinafter referred to as "a lattice A2") and a form as shown in FIG. 2B in which ligands 202b are located in lattice points and cross-linked through sites 201b with the dinuclear structure (hereinafter referred to as "a lattice B2") are considered. Note that, it is considered that a shape of the lattice is not limited to a quadrangle as shown in FIGS. 2A and 2B and various a polygon (such as a hexagon) can be used. Also, both a two dimensional (plane) structure and a three dimensional (solid) structure can be used for the lattice.

When the metal complex with such a lattice structure is mixed with light emitting material 203 with a suitable molecular size at the synthesis or at the film formation, the light emitting material can be introduced in the positions between the lattices of the lattice structure.

Further, when the metal complex with the dinuclear structure is used for the present invention, there is an advantage that an ordered structure such as a cubit lattice and a tetragonal lattice can be obtained relatively easily since it is easy to form the lattice in a rectangular shape. Therefore, as described above, since the pores are systematically arranged to becomes a state such as a pseudo superlattice structure, there is a possibility that a stable molecular exciton is produced and the improvement of a light emitting characteristic is led.

Thus, according to the present invention, a light emitting device which has an organic EL element including a light emitting layer made of an organic compound in which an EL is obtained and a metal complex with a dinuclear structure of two metal atoms as nuclei, is characterized in that the metal complex has a lattice structure in which sites with the dinuclear structure and ligands are alternately arranged, and the lattice structure has a structure that the sites with the dinuclear structure are located in lattice points and the lattice points are cross-linked through the ligands (lattice A2).

Also, according to the present invention, a light emitting device which has an organic EL element including a light emitting layer made of an organic compound in which an EL is obtained and a metal complex with a dinuclear structure of two metal atoms as nuclei, is characterized in that the metal complex has a lattice structure in which sites with the dinuclear structure and ligands are alternately arranged, and the lattice structure has a structure that the ligands are located in lattice points and the sites with the lattice points are cross-linked through the sites with the dinuclear structure (lattice B2).

Note that, since, as metallic species, metal elements of a group 5 to a group 11 among the transition series elements of Periodic table are easy to form the dinuclear structure, those are suitable for the present invention. Especially, niobium, tantalum, molybdenum, and tungsten are further suitable since they have a larger atomic number than bromine in which the heavy atom effect is clearly produced, and are low cost materials in the transition series elements.

Thus, according to the present invention, a light emitting device which has an organic EL element including a light emitting layer made of an organic compound in which an EL is obtained and a metal complex with a dinuclear structure which has two metal atoms as nuclei is characterized in that the metal complex has a lattice structure of the lattice A2 or the lattice B2, in which sites with the dinuclear structure and ligands are alternately arranged and the metal atoms are made of one element of group 5 elements to group 11 elements of Periodic table.

When the present invention as described above is embodied, a light emitting device which is light, has low consumption power, and which indicates various light emission colors, can be provided at a low cost. Further, an electrical device which is light, has low consumption power, indicates various light emission colors, and which has a low cost, can be provided by using such a light emitting device.

BRIEF DESCRIPTION OF THE DRAWINGS

In the accompanying drawings:

FIGS. 18A to 18F show concrete examples of an electrical appliance; and

DETAILED DESCRIPTION OF THE PREFERRED EMBODIMENTS

In order to carry out the present invention, it is important to select a metal complex which has a ligand with a rigid group. That is, in the case where a ligand, which has as a main chain a chain portion such as an alkyl group, is used, a lattice is twisted at cross-linking (or in becoming a lattice point) and thus pores with a uniform distribution cannot be formed. Therefore, an aromatic ring (specifically, a substituent including a paraphenylene group, a substituent including a heterocyclic ring, a substituent including a condensed ring, or the like) is desirably introduced as the rigid group.

Also, the above rigid group may include any substituent as a side chain. However, it is preferable that the substituent does not concern the formation of a complex. In other words, when the rigid group includes, for example, a hydroxyl group as a side chain, a complex is formed therein and thus there is a possibility that an expected lattice is not produced. Therefore, it is considered that the substituent which is preferable as a side chain of the above rigid group is an alkyl group, an alkoxyl group, or the like.

Figure 1A:
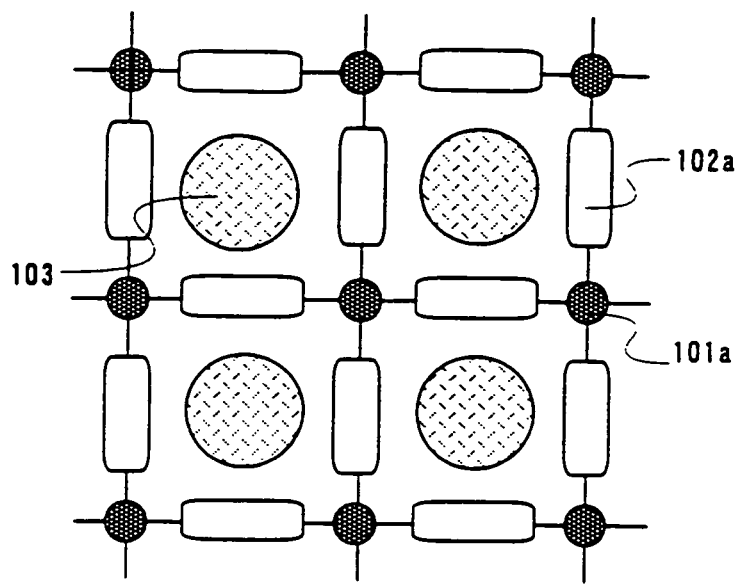
FIGS. 1A and 1B show concepts of a metal complex forming lattices.
Figure 1B:
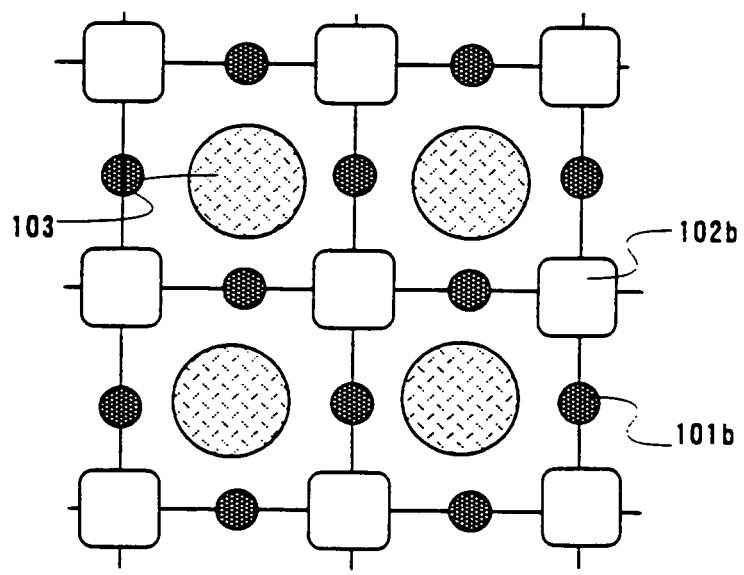
Figure 2A:
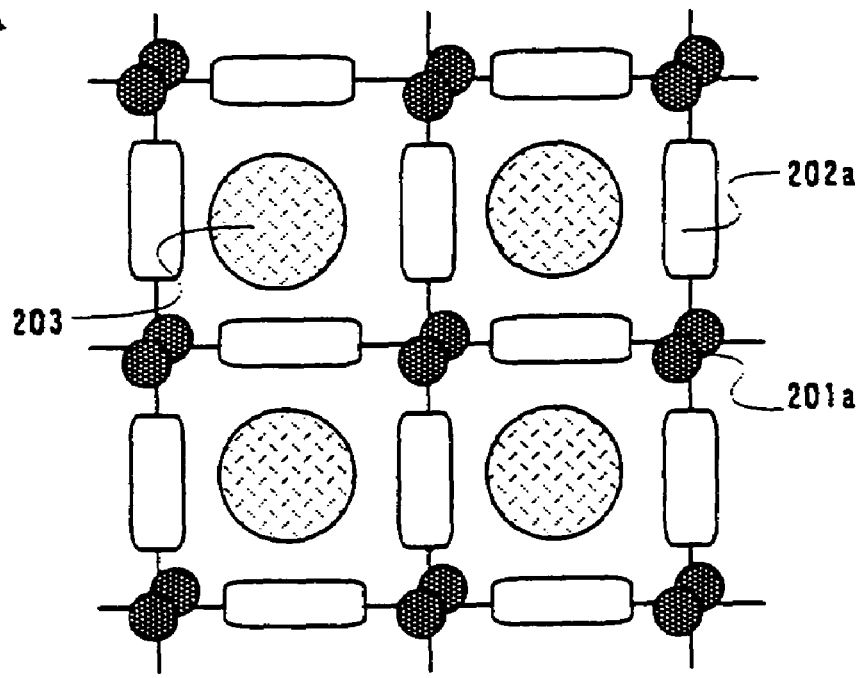
FIGS. 2A and 2B show concepts of the metal complex forming lattices.
Figure 2B:
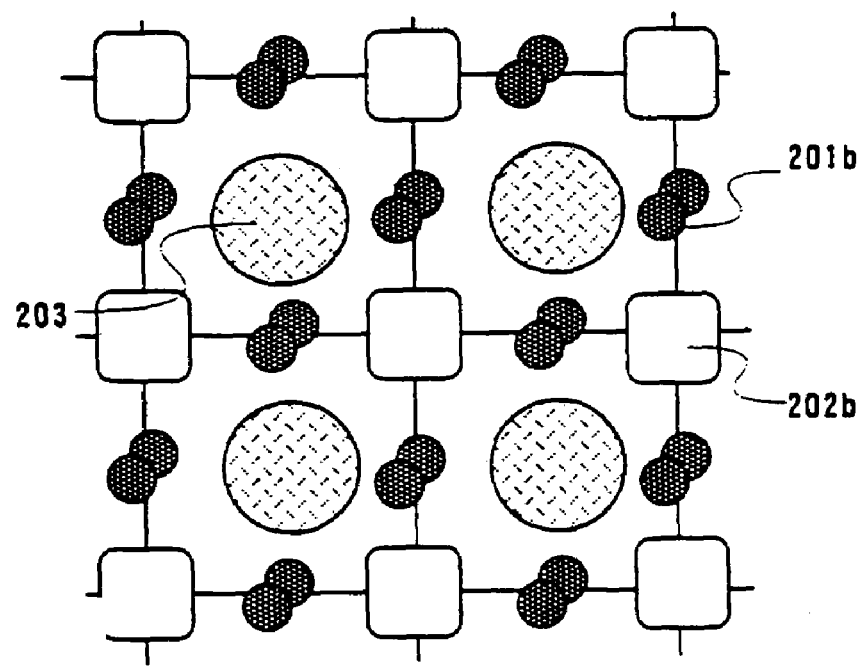
Figure 3A:
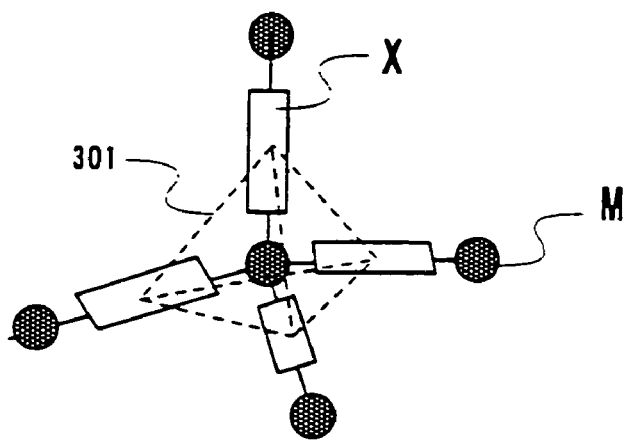
FIGS. 3A to 3C show structures of the metal complex forming lattices.
Figure 3B:
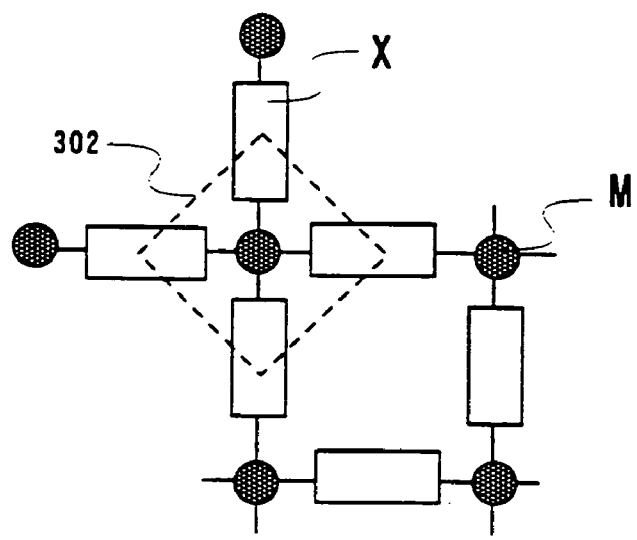
Figure 3C:
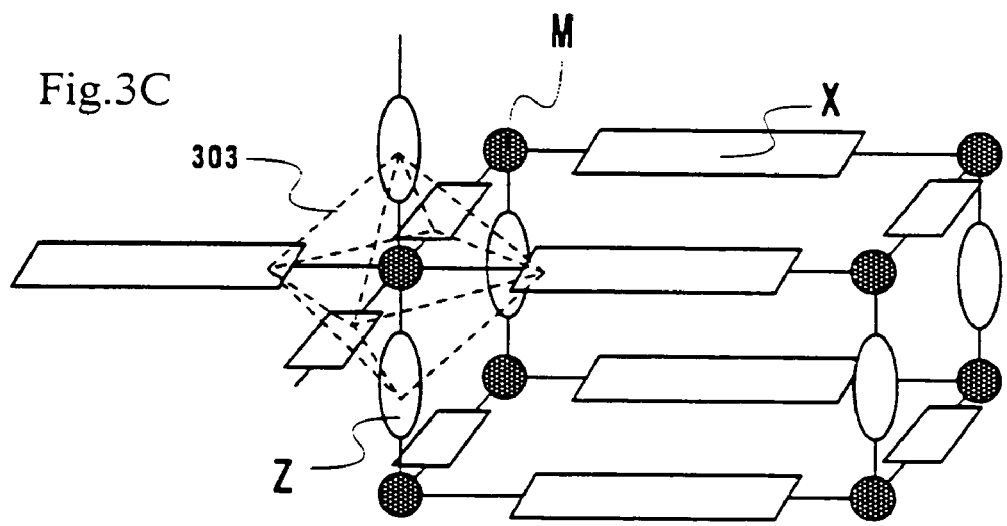

First, a form of a metal complex forming the lattice A1 will be described using FIGS. 3A to 3C and FIG. 4. As shown in FIGS. 3A to 3C, irrespective of the form of a ligand X, when central metal M has a tetrahedral coordination 301, the metal complex M becomes a solid structure such as a cristobalite type lattice (FIG. 3A). Also, when the central metal M has a plane coordination 302, the metal complex M becomes a square lattice (FIG. 3B). Further, when the central metal M can be made to have an octahedral coordination 303, the same as the ligand X or a ligand Z which is different from the ligand X is introduced and thus a cubic lattice or a tetragonal lattice can be produced (FIG. 3C).

Figure 4:
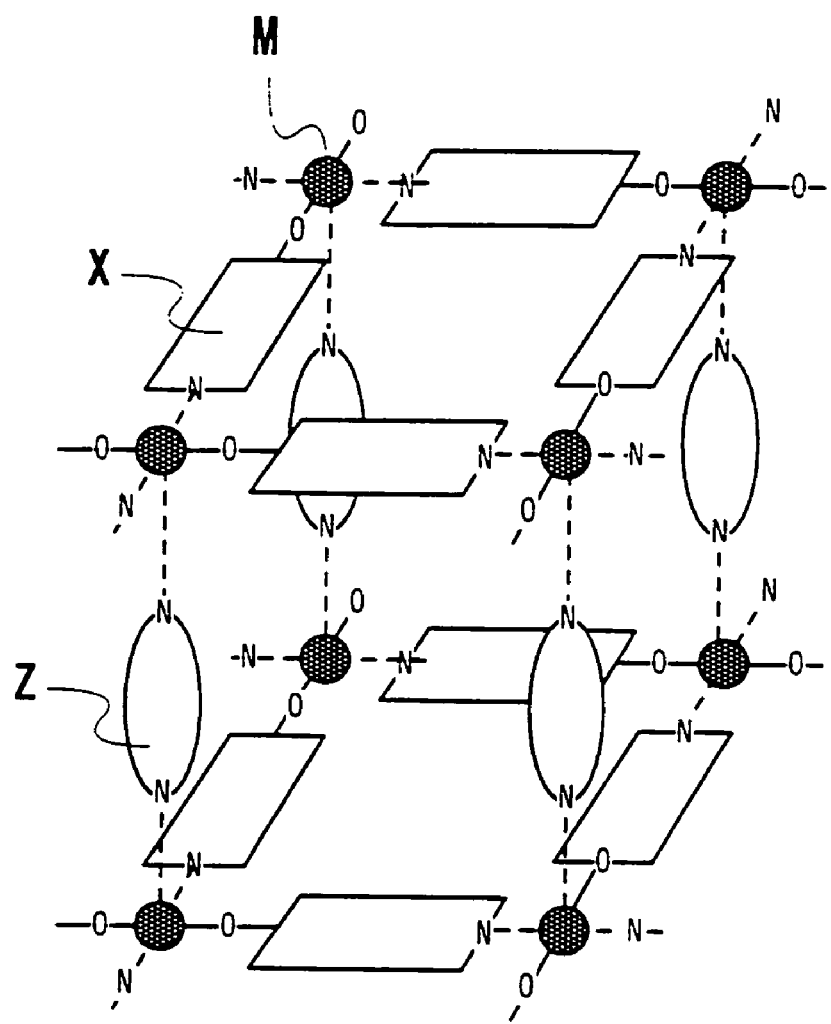
FIG. 4 shows a structure of the metal complex forming lattices.

Here, an example of FIG. 3C is shown in FIG. 4. When divalent metal in which octahedral coordination is allowed is used as a cental metal M, a ligand including phenolic anion and 4-pyridyl group at both edges, as represented by the following general formula (1), is preferably, used as the ligand X, and a ligand including unshared electron pairs at both edges (for example, pyrazine) is used as the ligand Z, respectively, it is considered that a structure as shown in FIG. 4 can be obtained (reference symbol "A" denotes a rigid substituent such as a substituent including a paraphenylene group, a substituent including a heterocyclic ring, or a substituent including a condensed ring).

[Chemical Formula 5]

(1)

Next, a form of a metal complex forming the lattice B1 will be described using FIGS. 5A and 5B, FIGS. 6A and 6B, and FIG. 7. First, as shown in FIGS. 5A and B, when the ligand X, which includes at the center an atom Sp which has four bonds with $Sp^3$ hybrid orbital (concretely, group 14 element of the table) and can coordinate in vertex directions of a tetrahedron 501, is selected, it is considered that a cristobalite type lattice (FIG. A) can be formed.

Figure 5A:
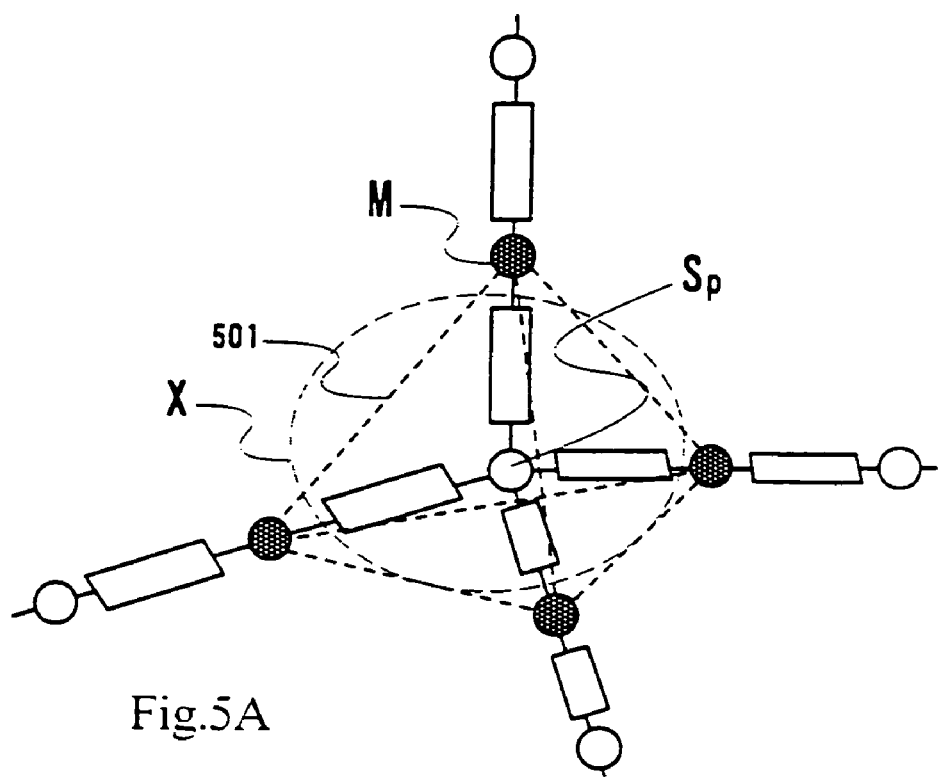
FIGS. 5A and 5B show structures of the metal complex forming lattices.
Figure 5B:
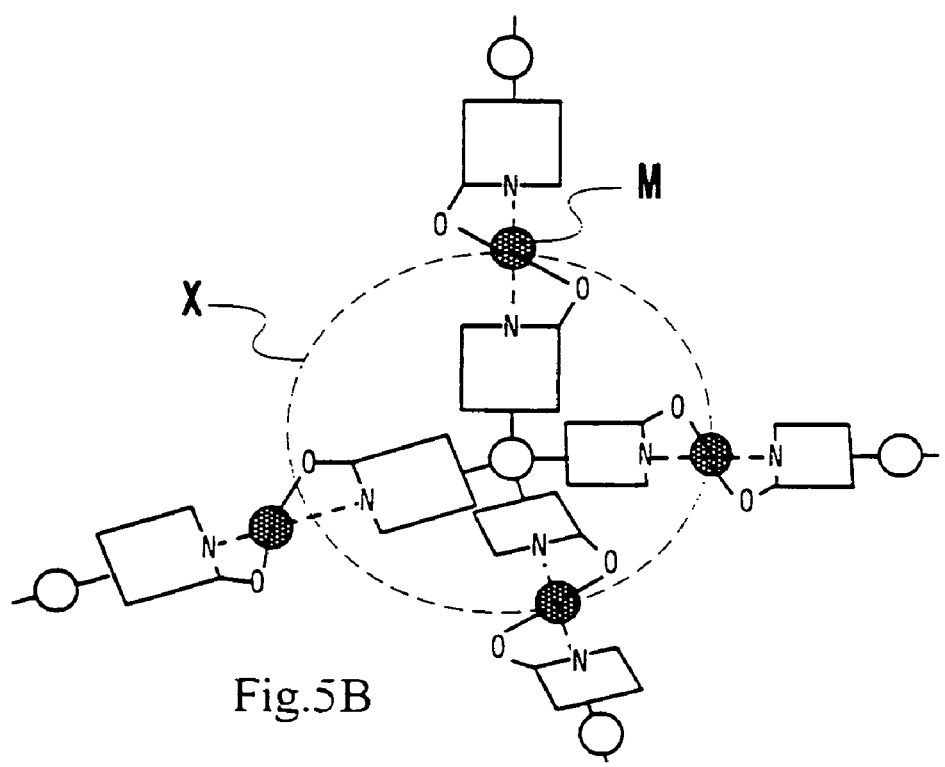

An example of FIG. 5A is shown in FIG. 5B. A ligand including 8-quinolinol skeleton in vertex directions of the tetrahedron, as represented be the following general formula (2), is preferably used as the ligand X (reference symbol "A" denotes a rigid substituent such as a substituent including a paraphenylene group, a substituent including a heterocyclic ring, or a substituent including a condensed ring, or may be omitted). Note that metal in which plane coordination is allowed is desirably selected as the cental metal M in this case (lattice is greatly twisted in the case of tetrahedral coordination).

[Chemical Formula 6]

(2)

Figure 6A:
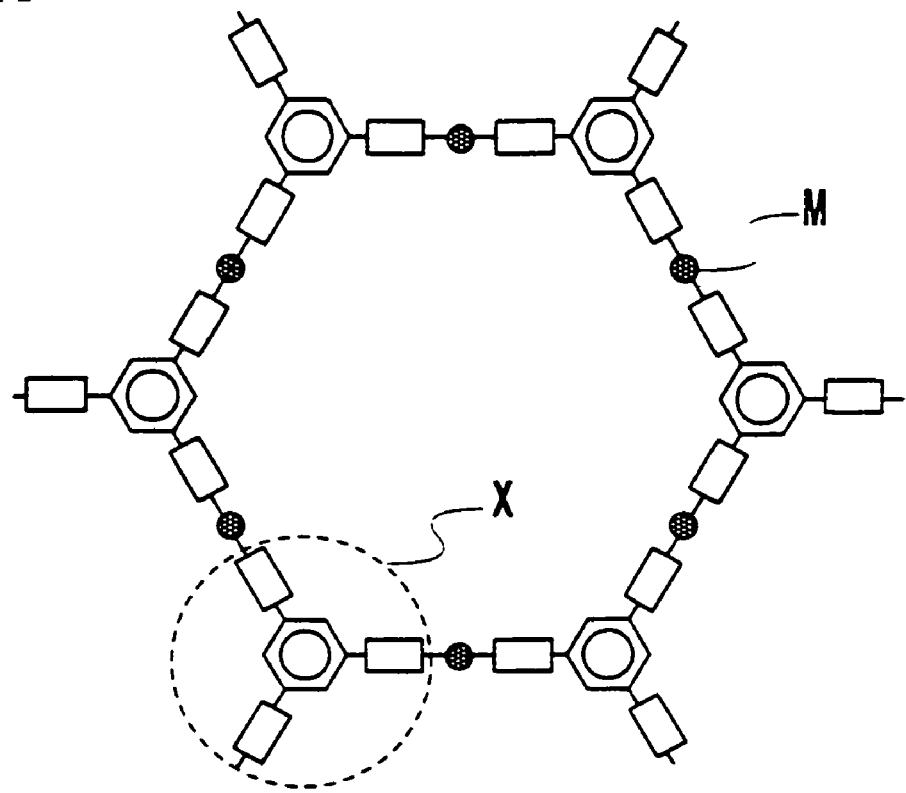
FIGS. 6A and 6B show structures of the metal complex forming lattices.
Figure 6B:
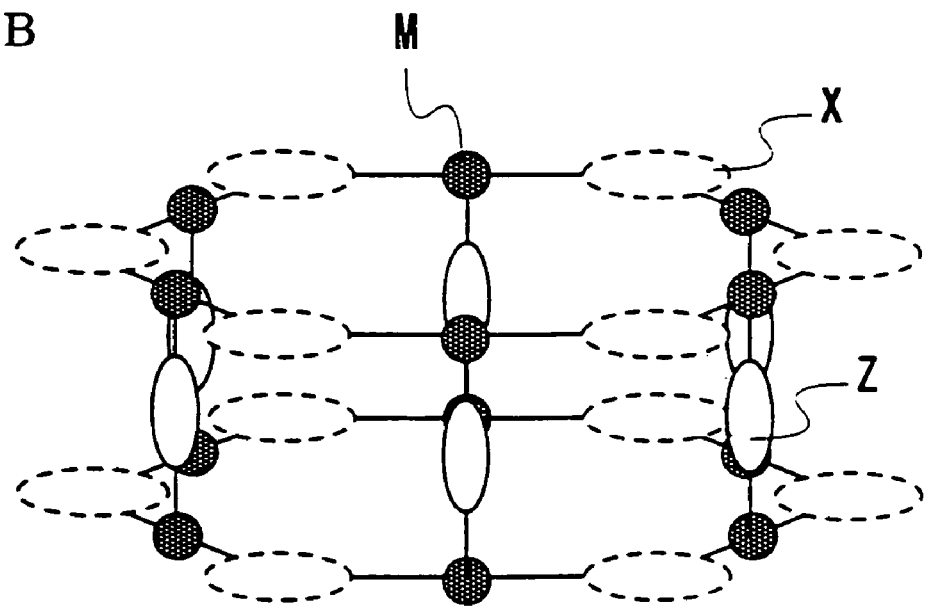

Also, when the ligand X which includes a benzene ring at the center and can coordinate in vertex directions of an equilateral triangle, as shown in FIG. 6A, is selected as a form of a metal complex forming the lattice B1, it is considered that a hexagonal lattice can be formed. As shown in FIG. 6B, when the same as the ligand X or the ligand Z which is different from the ligand X is introduced, it is considered that a pseudo honeycomb-shaped lattice (hexagonal lattice) can be formed.

Figure 7:
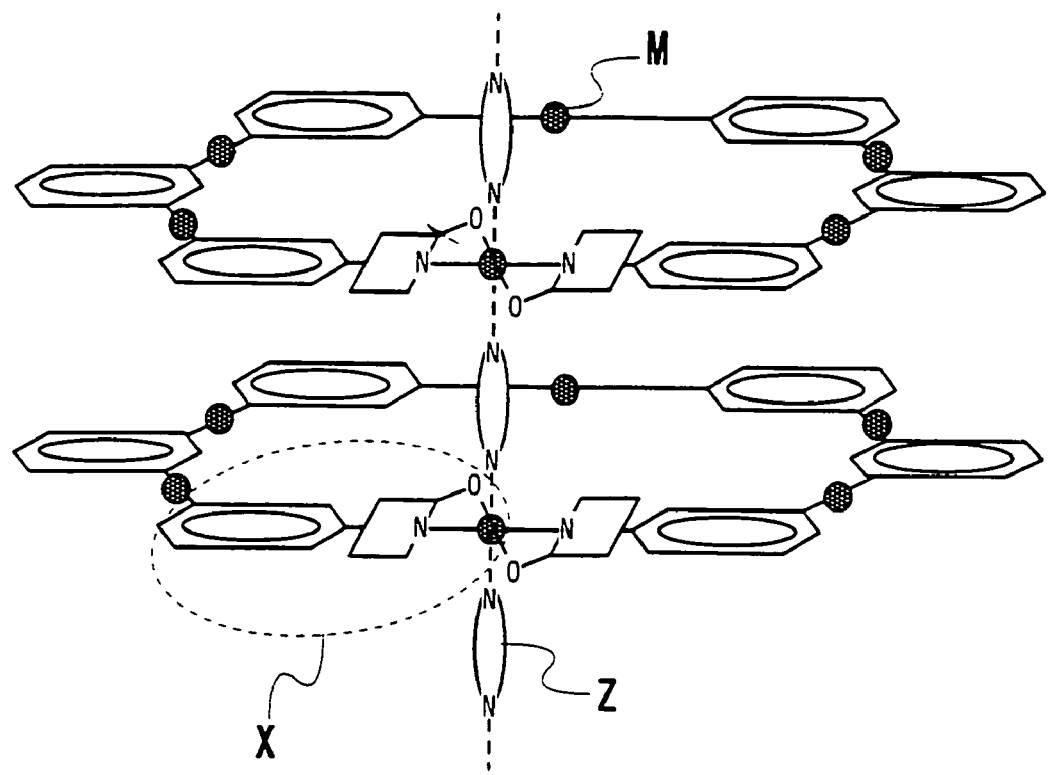
FIG. 7 shows a structure of the metal complex forming lattices.

An example of FIG. 6B is shown in FIG. 7. A ligand including quinolinol skeletons at positions 1, 3, and 5 of a benzene ring, as represented by the following general formula (3), is preferably used as the ligand X (reference symbol "A" denotes a rigid substituent such as a substituent including a paraphenylene group, a substituent including a heterocyclic ring, or a substituent including a condensed ring, or may be omitted). A ligand including unshared electron pairs at both edges (for example, pyrazine) is preferably used as the ligand Z. Note that it is necessary to select metal in which octahedral coordination is allowed as the central metal M in this case. With respect to the coordination state shown in FIG. 7, only metal atoms before a paper surface are shown for the purpose of simplification of the drawing.

[Chemical Formula 7]

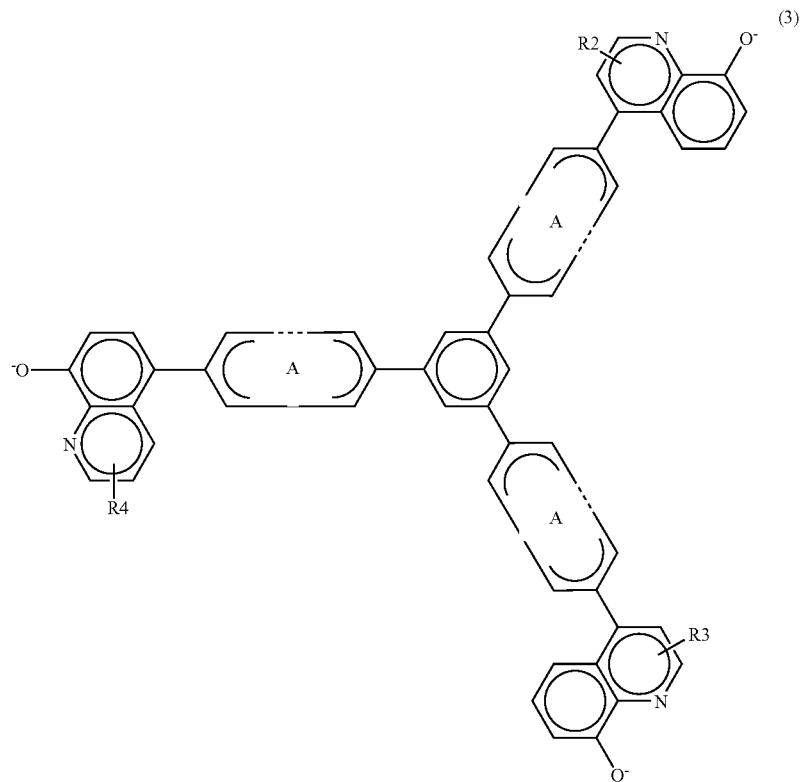

(3)

Figure 8A:
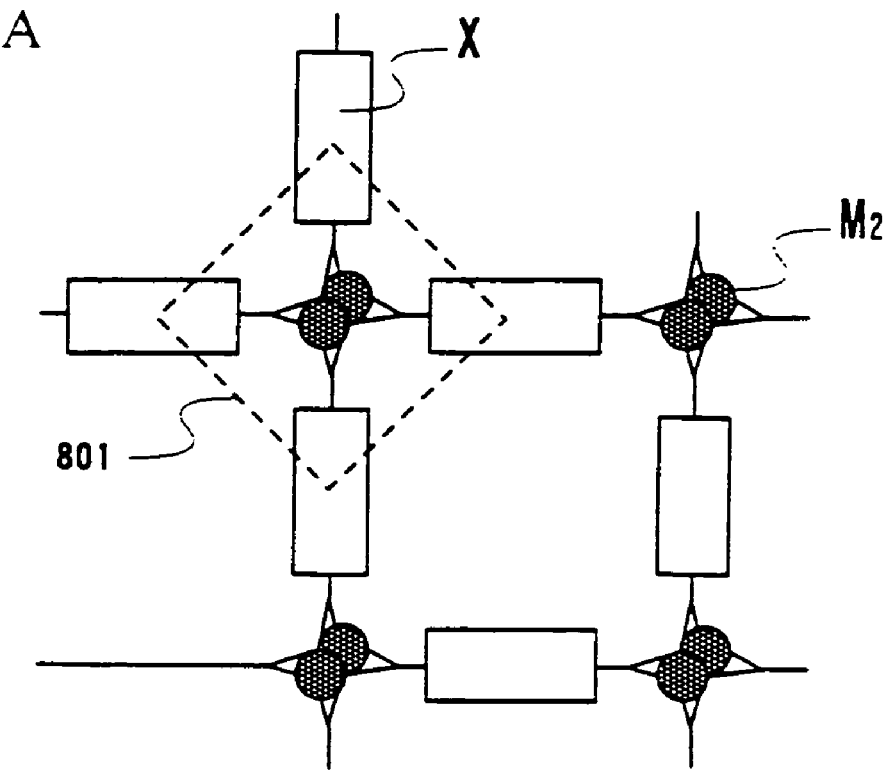
FIGS. 8A and 8B show structures of the metal complex forming lattices.
Figure 8B:
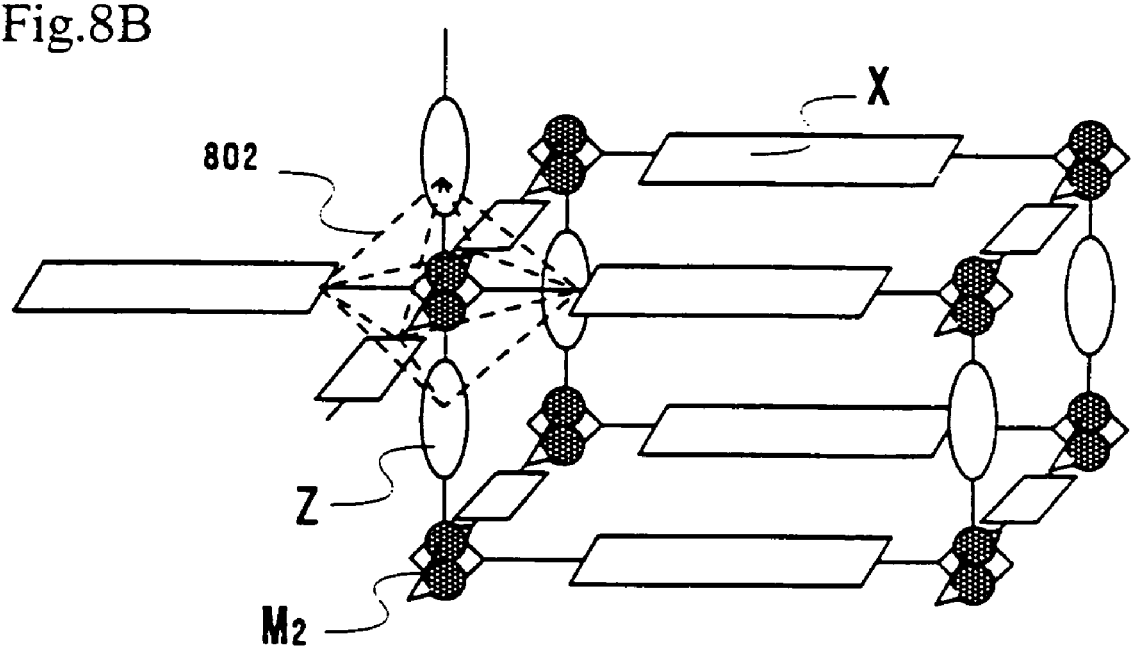

Next, a form of a metal complex of a dinuclear structure forming a lattice A2 will be described using FIGS. 8A and 8B and FIG. 9. As shown in FIGS. 8A and 8B, irrespective of the form of the ligand X, when a dinuclear structure $M_2$ has a plane coordination 801, it is considered that the metal complex becomes a square lattice (FIG. 8A). Further, when the dinuclear structure $M_2$ can be made to has an octahedral coordination 802, the same as the ligand X or the ligand Z which is different from the ligand X is introduced and thus it is considered that a cubic lattice or a tetragonal lattice can be produced (FIG. 8B).

Figure 9:
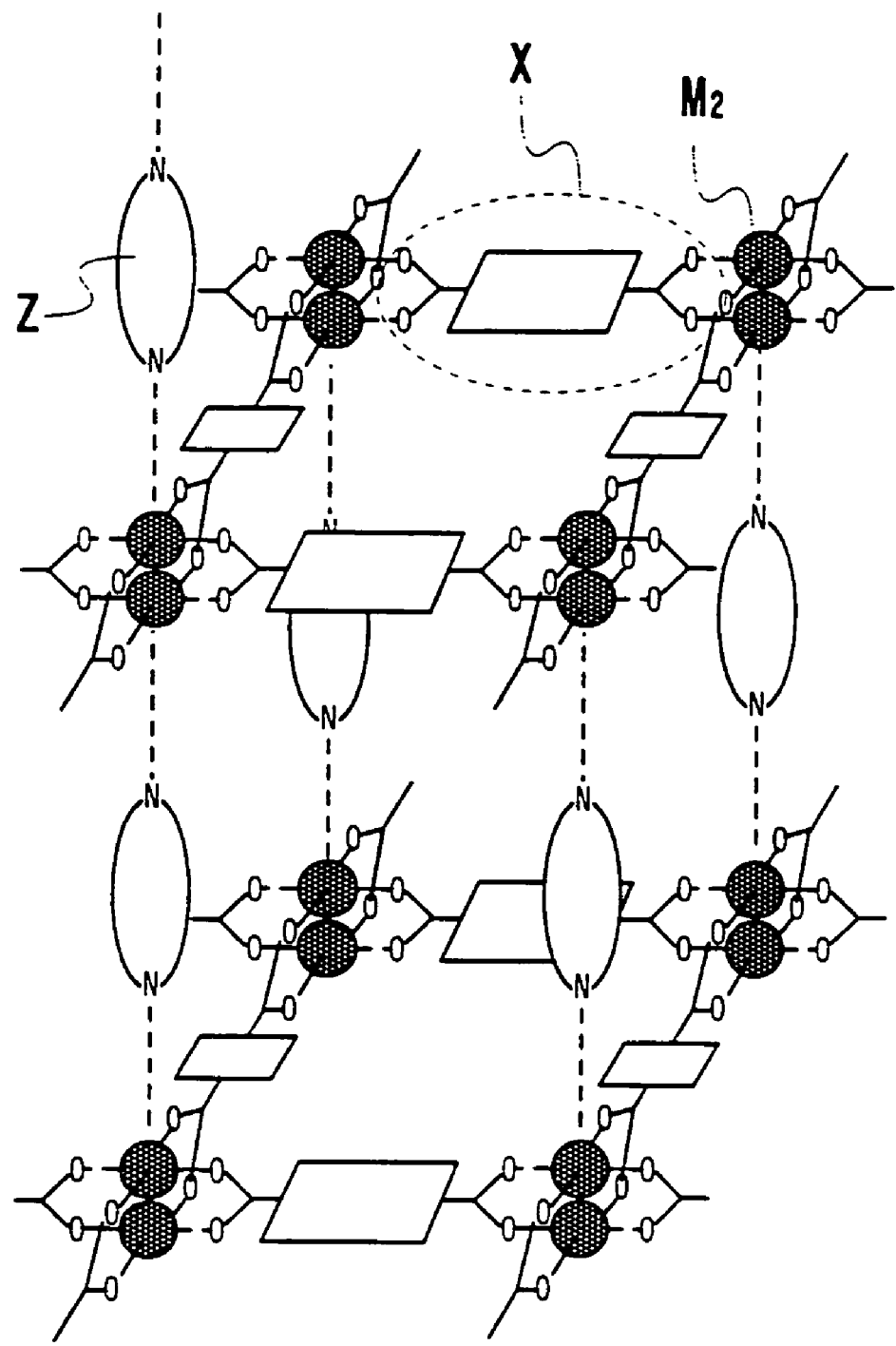
FIG. 9 shows a structure of the metal complex forming lattices.

Here, an example of FIG. 8B is shown in FIG. 9. A dicarboxylic acid ion including carboxyl groups at both edges, as represented by the following general formulas (4) to (6), is preferably used as the ligand X. (Note that reference symbol "a" denotes a substituent including a paraphenylene group, a substituent including a heterocyclic ring, or a substituent including a condensed ring. Reference symbol "b" denotes at least one cycloalkylene group and the group "b" may include a substituent. Reference symbol "n" denotes an integer equal to or larger than 1.) A ligand including unshared electron pairs at both edges (for example, pyrazine) is preferably used as the ligand Z. Thus, the structure as shown in FIG. 9 can be obtained.

[Chemical Formula 8]

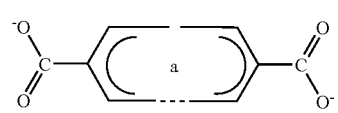

(4)

[Chemical Formula 9]

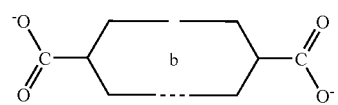

(5)

[Chemical Formula 10]

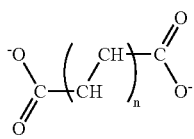
(6)

Further, when a ligand including unshared electron pairs at both edges (for example, pyrazine) is coordinated in a dinuclear complex with a ligand represented by the following general formula (7), a lattice structure can be obtained (reference symbol "c" denotes a substituent including an aryl group, a substituent including a heterocyclic ring, or a substituent including a condensed ring).

[Chemical Formula 11]

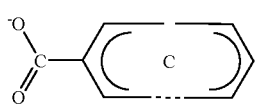
(7)

Note that the metal complex forming the lattice structure of A2 type, as described in this embodiment mode, (dinuclear complex which has the ligand represented by any of the general formulas (4) to (7)) is disclosed in the following reference (Reference 6: Satoshi Takamizawa, "Metal complex trapping molecular", Chemistry and Chemical Industry Vol. 53 No. 2 (2000) pp. 136–139).

Figure 10A:
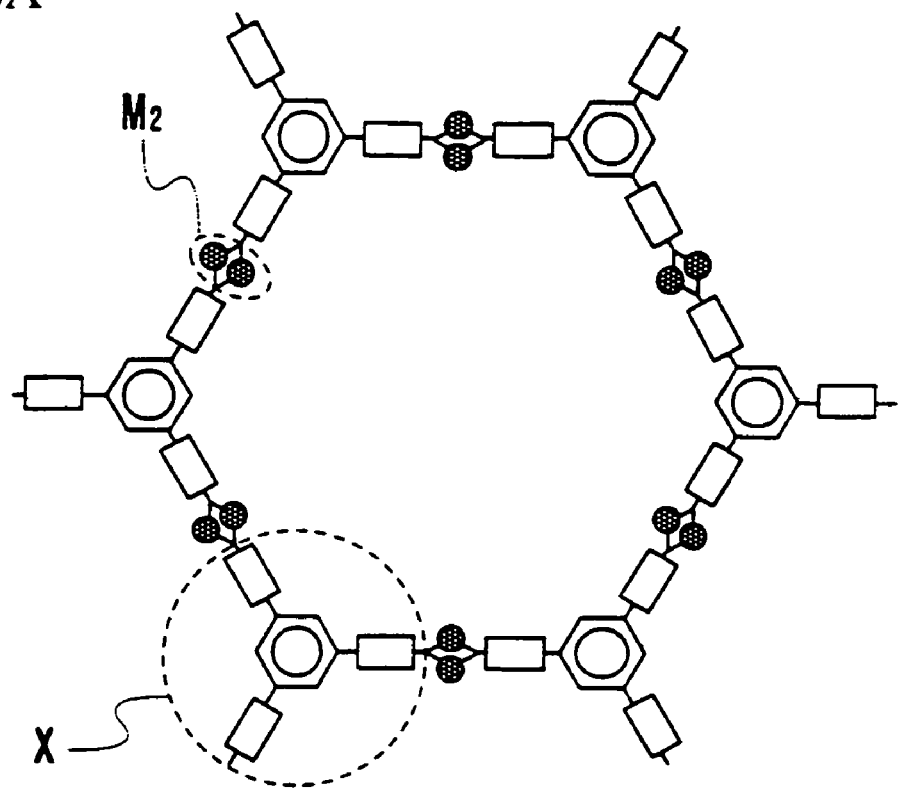
FIGS. 10A and 10B show structures of the metal complex forming lattices.

Finally, a form of a metal complex of a dinuclear structure forming the lattice B2 will be described using FIGS. 10A and 10B. As shown in FIG. 10A, when the ligand X which includes a benzene ring at the center and can coordinate in vertex directions of an equilateral triangle, is selected, it is considered that a hexagonal lattice can be formed. Also, as shown in FIG. 10B, when the same as the ligand X or the ligand Z which is different from the ligand X is introduced, it is considered that a pseudo honeycomb-shaped lattice (hexagonal lattice) can be formed.

Figure 10B:
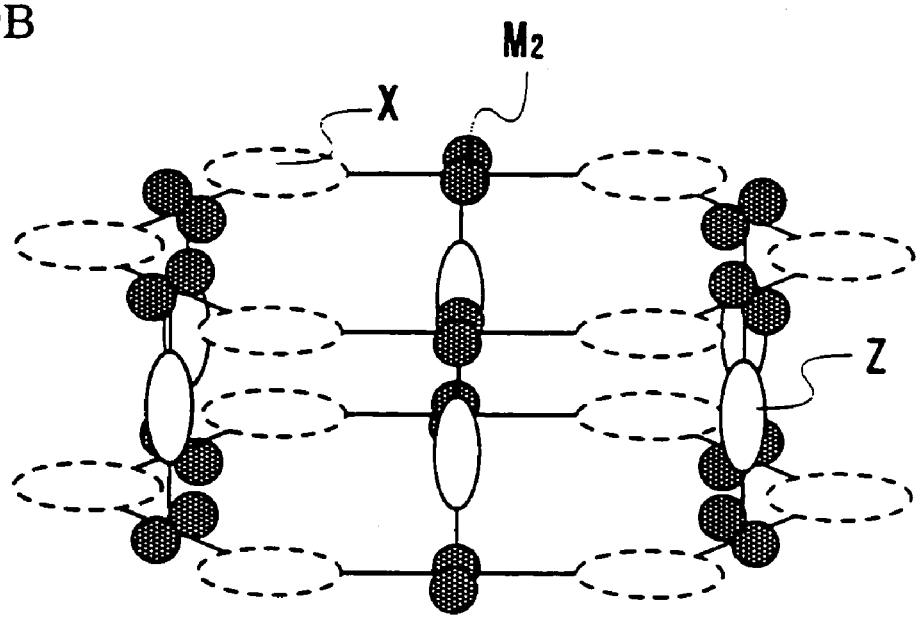
Figure 11:
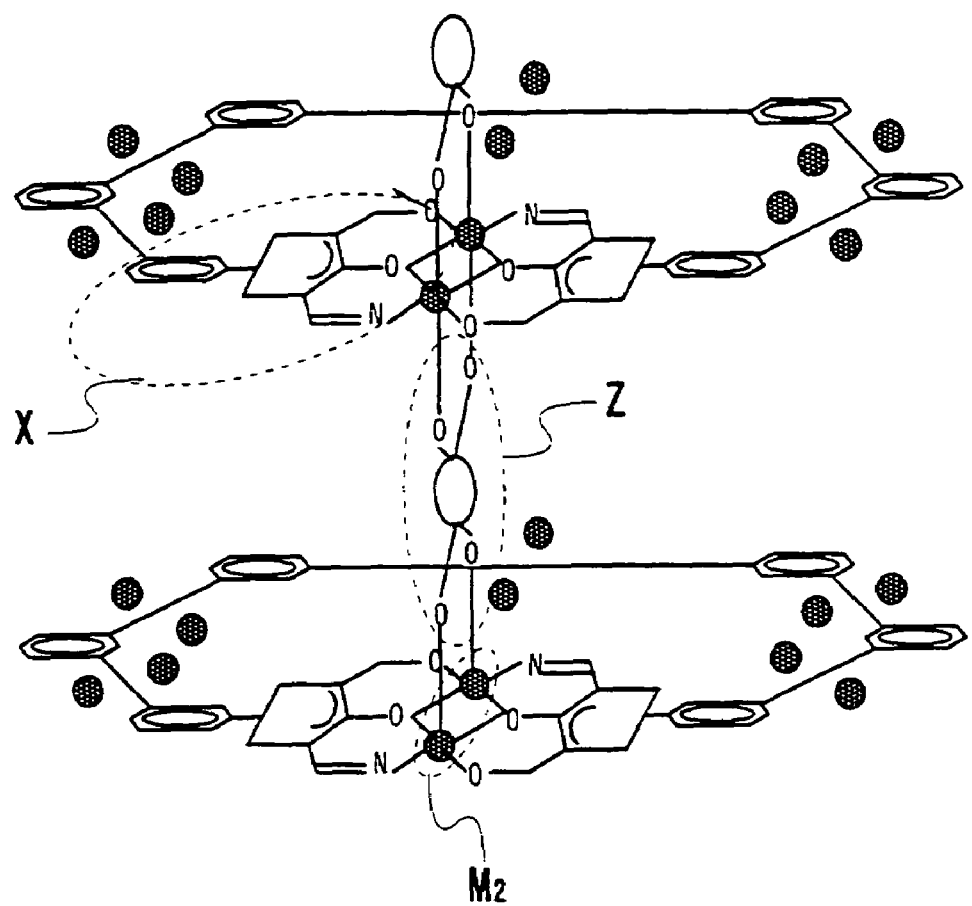
FIG. 11 shows a structure of the metal complex forming lattices.

An example of FIG. 10B is shown in FIG. 11. A ligand including formylsalicylic acid skeletons at positions 1, 3, and 5 of a benzene ring as represented by the following general formula (8), or a ligand including carboxysalithylideneamine skeletons at positions 1, 3, and 5 of a benzene ring as represented by the following general formula (9) is preferably used as the ligand X (reference symbol "A" denotes a rigid substituent such as a substituent including a paraphenylene group, a substituent including a heterocyclic ring, or a substituent including a condensed ring, or may be omitted). With respect to the ligand Z, a ligand including unshared electron pairs at both edges (for example, pyrazine) is preferably used in the case where the central metal is divalent, and a dicarboxylic acid ion is preferably used in the case where the central metal is trivalent. In FIG. 11, the ligand X represented by the above general formula (9) and the ligand Z which is the dicarboxylic acid ion is used. Note that, with respect to the coordination state shown in FIG. 11, only metal atoms before a paper surface are shown for the purpose of simplification of the drawing.

[Chemical Formula 12]

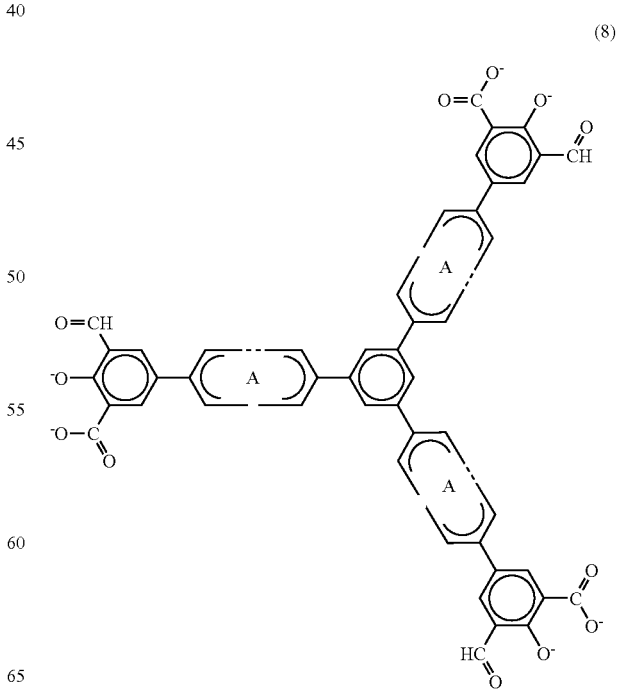
(8)

[Chemical Formula 13]

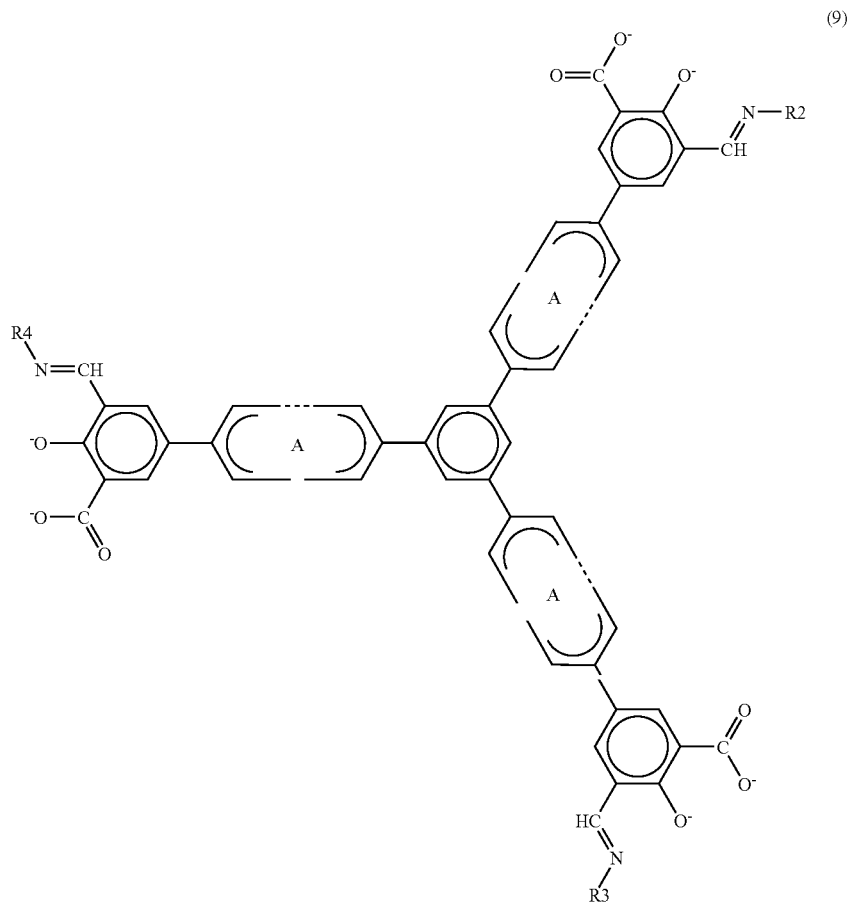

(9)

Now, it is said that the most preferred form in the above embodiment mode is the metal complex which forms the lattice structure of A2 type. This is because its synthesis method is already established to some extent and relatively easy. According to the following Reference 7, a synthesis method for a dinuclear complex (copper (II) terephthalate) made of a ligand (terephthalic acid ion) in which "a" is a phenylene group and a copper (II) ion in the general formula (4) is only to mix respective methanol solutions of copper (II) formate tetrahydrate and terephthalic acid and it is apparent that this method is very easy (Reference 7: Wasuke Mori and Satoshi Takamizawa, "Novel Micropore Substance", Chemistry and Chemical Industry, Vol. 51, No. 2 (1998), pp.210–212).

Here, of the ligands described in Reference 6, the ligands corresponding to the general formulas (4) to (7) are listed in the following Table 1. There are Cu, Cr, Mo, W, Rh, Re, Ru, and the like as the central metal composing the dinuclear structure. It is indicated that, with respect to a dinuclear complex using a ligand of No 7 in the Table 1 and having Ru as the cental metal, a three dimensional structure can be obtained by cross-linking using pyrazine.

TABLE 1

| | classification | substituent | structural formula |
|---|---|---|---|
| No. 1 | general formula (4) | a → paraphenylene group | 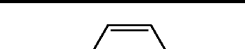 |
| No. 2 | general formula (4) | a → 2,5-pyridylene group | 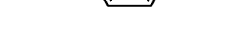 |

TABLE 1-continued

| classification | substituent | structural formula |
|---|---|---|
| No. 3 | general formula (4) | a → 2,6-naphtylene group |
| No. 4 | general formula (5) | b → 1,4-cyclohexylene group |
| No. 5 | general formula (6) | n = 1 |
| No. 6 | general formula (6) | n = 2 |
| No. 7 | general formula (7) | c → phenyl |

When the metal complex for which these easy synthesis methods are established is applied as the light emitting layer of an organic EL element, it is suitable for the present invention since the embodiment of the present invention is relatively easy.

Figure 12:
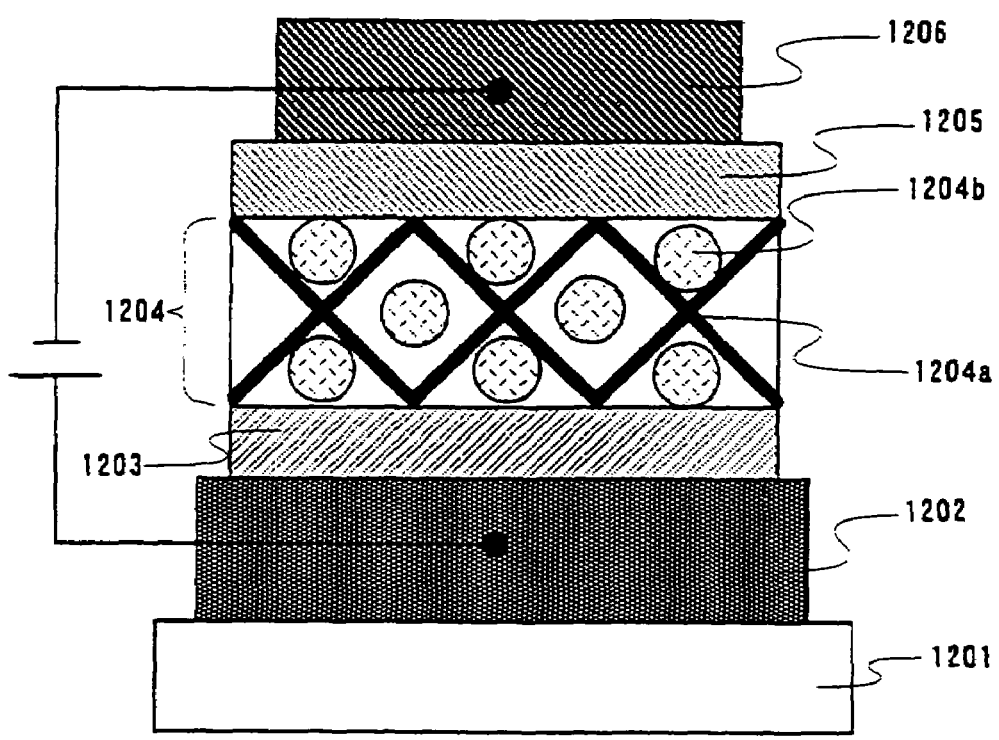
FIG. 12 shows a structure of an organic EL element.

Hereinafter, the respective structures described in the embodiment mode of the present invention will be specifically shown by examples. Note that the structure of the organic EL elements according to Embodiments 1 to 7 is shown in FIG. 12.

Embodiment 1

In this embodiment, an organic EL element using the metal complex as shown in FIG. 3B in the embodiment mode of the present invention will be specifically shown by in example, Cu (II) which is divalent and in which plane coordination is allowed is used as the central metal M and a compound represented by the following formula (10) is used as the ligand X.

[Chemical Formula 14]

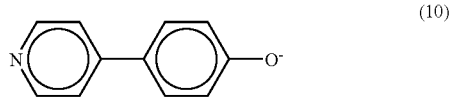

(10)

First, an aqueous solution of polythylenedioxythiophene (hereinafter referred to as "PEDOT"), which is doped with sulfonic acid to improve conductivity, is formed by spin coating on a glass substrate 1201 on which ITO which is a transparent anode 1202 is formed, and moisture is evaporated to produce a hole injection layer 1203. Its film thickness is desirably about 30 nm.

Then, a metal complex 1204a with a square lattice structure, made of Cu (II) which is the cental metal M and a ligand represented by the above formula (10) as the ligand X, and a light emitting material 1204b, made of tris(8-quinolinolato)aluminum (hereinafter referred to as "Alq$_3$"), are dissolved into the same organic solvent. This solution is applied onto the PEDOT by spin coating and the solvent is evaporated to produce an electron transporting light emitting layer 1204. Its film thickness is desirably about 50 nm.

With respect to a method of manufacturing the above metal complex 1204a with the square lattice structure, it is considered that metal salt including Cu(II) and a ligand are mixed and thus the complex can be manufactured. At this time, it is necessary to control an abundance ratio of the central metal M and the ligand X so as to be M:X=1:2.

Finally, a lithiumacetylacetonate complex (hereinafter referred to as "Li(acac)") is formed as an electron injection layer 1205 at about 2 nm and Al is formed as a cathode 1206 at about 100 nm to produce an organic EL element.

Embodiment 2

In this embodiment, an organic EL element using the metal complex as shown in FIG. 5B in the embodiment mode of the present invention will be specifically shown by an example, Ni (II) which is divalent and in which plane coordination is allowed is used as the central metal M, and a compound represented by the following formula (11) is used as the ligand X.

[Chemical Formula 15]

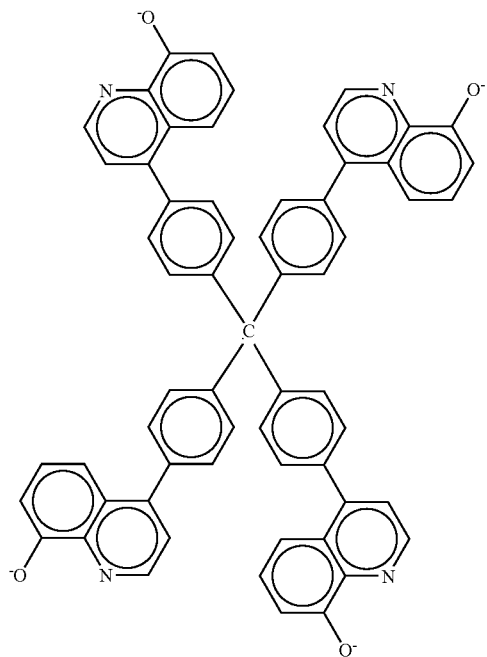

(11)

[Chemical Formula 16]

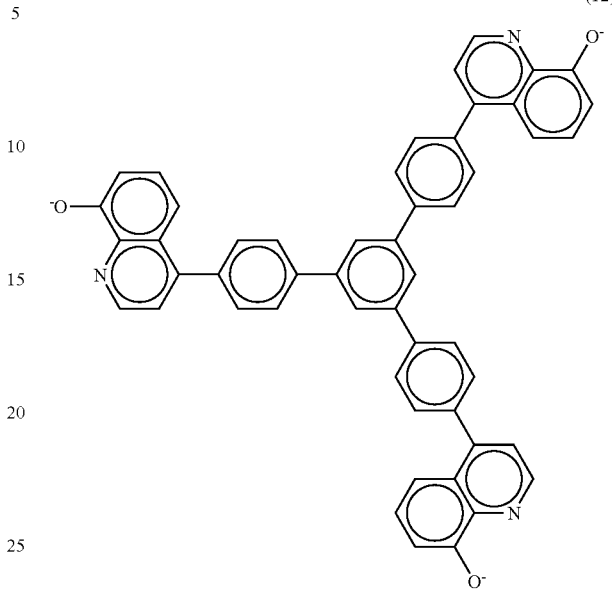

(12)

First, an aqueous solution of PEDOT which is doped with sulfonic acid to improve conductivity is formed by spin coating on a glass substrate 1201 on which ITO as a transparent anode 1202 is formed and moisture is evaporated to produce a hole injection layer 1203. Its film thickness is desirably about 30 nm.

Then, a metal complex 1204a with a cristobalite type lattice structure, made of Ni(II) which is the cental metal M and a ligand represented by the above formula (11) as the ligand X, and a light emitting material 1204b made of Alq$_3$ are dissolved into the same organic solvent. This solution is applied onto the PEDOT by spin coating and the solvent is evaporated to produce an electron transporting light emitting layer 1204. Its film thickness is desirably about 50 nm.

With respect to a method of manufacturing the above metal complex 1204a with the cristobalite type lattice structure, it is considered that metal salt including Ni(II) and a ligand are mixed and thus the complex can be manufactured. At this time, it is necessary to control an abundance ratio of the central metal M and the ligand X so as to be M:X=1:2.

Finally, Li(acac) is formed as an electron injection layer 1205 at about 2 nm and Al is formed as a cathode 1206 at about 100 nm to produce an organic EL element.

Embodiment 3

In this embodiment, an organic EL element using the metal complex as shown in FIG. 7 in the embodiment mode of the present invention will be specifically shown by an example, Co(II) which is divalent and in which octahedral coordination is allowed is used as the central metal M, a compound represented by the following formula (12) is used as the ligand X, and pyrazine is used as the ligand Z.

First, an aqueous solution of PEDOT which is doped with sulfonic acid to improve conductivity is formed by spin coating on a glass substrate 1201 on which ITO which is a transparent anode 1202 is formed, and moisture is evaporated to produce a hole injection layer 1203. Its film thickness is desirably about 30 nm.

Then, a metal complex 1204a with a hexagonal lattice structure, made of Co(II) which is the cental metal M, a ligand represented by the above formula (12) as the ligand X, and pyrazine which is the ligand Z, and a light emitting material 1204b made of Alq$_3$ are dissolved into the same organic solvent. This solution is applied onto the PEDOT by spin coating and the solvent is evaporated to produce an electron transporting light emitting layer 1204. Its film thickness is desirably about 50 nm.

With respect to a method of manufacturing the above metal complex 1204a with the hexagonal lattice structure, it is considered that metal salt including Co(II) and a ligand are mixed and thus the complex can be manufactured. At this time, it is necessary to control an abundance ratio of the central metal M, the ligand X, and the ligand Z so as to be M:X:Z=3:2:3.

Finally, Li(acac) is formed as an electron injection layer 1205 at about 2 nm and Al is formed as a cathode 1206 at about 100 nm to produce an organic EL element.

Embodiment 4

In this embodiment, an organic EL element using the dinuclear complex as shown in FIG. 9 in the embodiment mode of the present invention will be specifically shown by an example. Mo(II) which is a divalent metal is used as the central metal M, a compound represented by the following formula (13) is used as the ligand X, and pyrazine is used as the ligand Z.

[Chemical Formula 17]

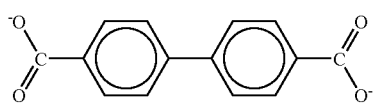

(13)

First, an aqueous solution of PEDOT which is doped with sulfonic acid to improve conductivity is formed by spin coating on a glass substrate 1201 on which ITO which is a transparent anode 1202 is formed, and moisture is evaporated to produce a hole injection layer 1203. Its film thickness is desirably about 30 nm.

Then, a dinuclear complex 1204a with a tetragonal lattice structure, made of Mo(II) which is the cental metal M, a ligand represented by the above formula (13) as the ligand X, and pyrazine which is the ligand Z, and a light emitting material 1204b made of Alq$_3$ are dissolved into the same organic solvent. This solution is applied onto the PEDOT by spin coating and the solvent is evaporated to produce an electron transporting light emitting layer 1204. Its film thickness is desirably about 50 nm.

With respect to a method of manufacturing the above dinuclear complex 1204a with the tetragonal lattice structure, it is considered that the complex can be manufactured by a ligand substitution reaction of mixing a dinuclear Mo(II) complex with copper acetate monohydrate type and a ligand. At this time, it is necessary to control an abundance ratio of the central metal M, the ligand X, and the ligand Z so as to be M:X:Z=2:2:1.

Finally, Li(acac) is formed as an electron injection layer 1205 at about 2 nm and Al is formed as a cathode 1206 at about 100 nm to produce an organic EL element.

Embodiment 5

In this embodiment, an organic EL element using the dinuclear complex as shown in FIG. 11 in the embodiment mode of the present invention will be specifically shown by an example Mn(III) which is a trivalent metal is used as the central metal M, a compound represented by the following formula (14) is used as the ligand X, and terephthalic acid is used as the ligand Z.

[Chemical Formula 18]

First, an aqueous solution of PEDOT which is doped with sulfonic acid to improve conductivity is formed by spin coating on a glass substrate 1201 on which ITO which is a transparent anode 1202 is formed, and moisture is evaporated to produce a hole injection layer 1203. Its film thickness is desirably about 30 nm.

Then, a dinuclear complex 1204a with a hexagonal lattice structure, made of Mn(III) which is the cental metal M, a ligand represented by the above formula (14) as the ligand X, and terephthalic acid as the ligand Z, and a light emitting material 1204b made of Alq$_3$ are dissolved into the same organic solvent. This solution is applied onto the PEDOT by spin coating and the solvent is evaporated to produce an electron transporting light emitting layer 1204. Its film thickness is desirably about 50 nm.

With respect to a method of manufacturing the above dinuclear complex 1204a with the hexagonal lattice structure, it is considered that metal salt including Mo(III) and a ligand are mixed and thus the complex can be manufactured. At this time, it is necessary to control an abundance ratio of the central metal M, the ligand X, and the ligand Z so as to be M:N:Z=6:2:3.

Finally, Li(acac) is formed as an electron injection layer 1205 at about 2 nm and Al is formed as a cathode 1206 at about 100 nm to produce an organic EL element.

Embodiment 6

In this embodiment, a dinuclear complex using a ligand shown in Table 1 in the embodiment mode of the present invention will be specifically shown by an example and a method of manufacturing an organic light emitting element using such a complex will be described. Here, a copper dinuclear complex with No. 1 (terephthalic acid ion: the following formula (15)) in Table 1 is used.

[Chemical Formula 19]

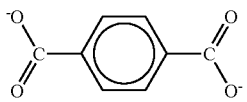

(15)

First, an aqueous solution of PEDOT which is doped with sulfonic acid to improve conductivity is formed by spin coating on a glass substrate 1201 on which ITO which is a transparent anode 1202 is formed, and moisture is evaporated to produce a hole injection layer 1203. Its film thickness is desirably about 30 nm.

Then, a methanol solution of copper formate tetrahydrate as a raw material of central metal Cu, a methanol solution of terephthalic acid as a raw material of a ligand, and a methanol solution of $Alq_3$ are mixed. Simultaneously, the mixed solution is applied onto the PEDOT by spin coating and the solvent is evaporated to produce an electron transporting light emitting layer 1204. As indicated in Reference 6, copper formate tetrahydrate and terephthalic acid are reacted to produce a dinuclear complex 1204a with a lattice structure. It is considered that a light emitting material 1204b made of Alq3 is trapped in the lattice. The film thickness is desirably about 50 nm.

Finally, Li(acac) is formed as an electron injection layer 1205 at about 2 nm and Al is formed as a cathode 1206 at about 100 nm to produce an organic EL element.

Embodiment 7

In this embodiment, a dinuclear complex using a ligand shown in Table 1 in the embodiment mode of the present invention will be specifically shown by an example and a method of manufacturing an organic light emitting element using such a complex will be described. Here, a rhodium dinuclear complex with No. 7 (benzoic acid ion: the following formula (16)) in Table 1 is used.

[Chemical Formula 15]

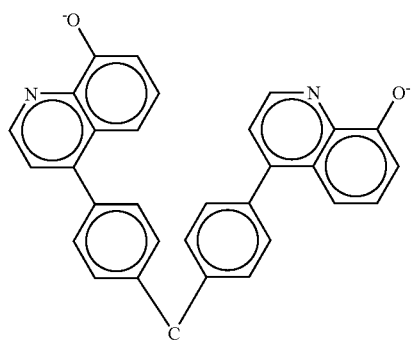

(11)

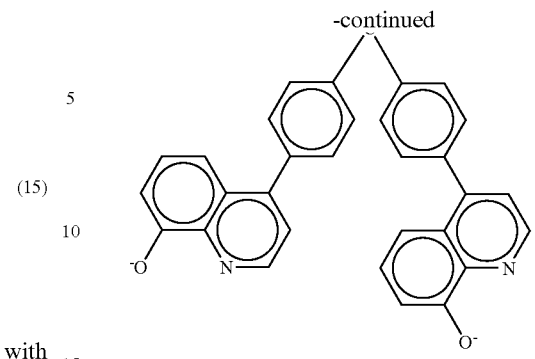

First, an aqueous solution of PEDOT which is doped with sulfonic acid to improve conductivity is formed by spin coating on a lass substrate 1201 on which ITO as a transparent anode 1202 is formed, and moisture is evaporated to produce a hole injection layer 1203. Its film thickness is desirably about 30 nm.

Next, the benzoic acid rhodium dinuclear complex indicated in Reference 6 is dissolved into pyrazine and this solution and $Alq_3$ are mixed. After that, the mixed solution is applied onto the PEDOT by spin coating and the solvent is evaporated at a reduced pressure to produce an electron transporting light emitting layer 1204. In this case, as indicated in Reference 6, a dinuclear complex 1204a with a lattice structure, made of the benzoic acid rhodium dinuclear complex and the pyrazine, is produced and thus it is considered that a light emitting material 1204b made of Alq3 is trapped in the lattice. The film thickness is desirably about 50 nm.

Finally, Li(acac) is formed as an electron injection layer 1205 at about 2 nm and Al is formed as a cathode 1206 at about 100 nm to produce an organic EL element.

Embodiment 8

Figure 13:
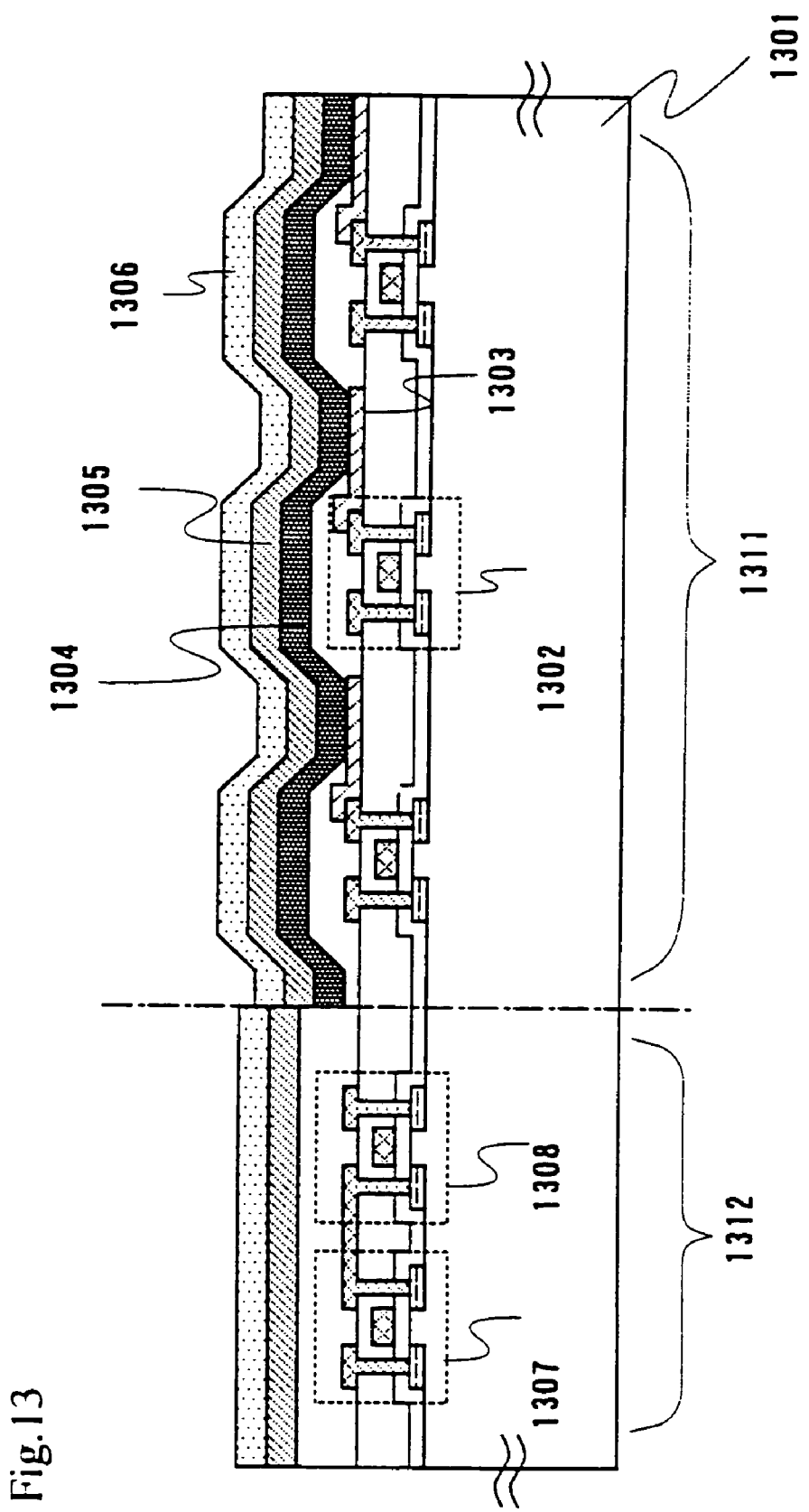
FIG. 13 shows a cross sectional structure of a light emitting device.

In this embodiment, a light emitting device including an organic EL element of the present invention will be described. FIG. 13 is a sectional view of an active matrix type light emitting device using the organic EL element of the present invention. Incidentally, although a thin film transistor (hereinafter referred to as a TFT) is used here as an active element, a MOS transistor may be used.

Besides, although a top gate TFT (specifically, a planar TFT) is exemplified as a TFT, a bottom gate TFT (typically, an inverted stagger TFT) can also be used.

In FIG. 13, reference numeral 1301 designates a substrate, and the substrate transparent to visible light is used here. Specifically, a glass substrate, a quartz substrate, a crystallized glass substrate, or a plastic substrate (including a plastic film) may be used. Incidentally, the substrate 1301 also includes an insulating film provided on the surface of the substrate.

A pixel portion 1311 and a driving circuit 1312 are provided on the substrate 1301. Here, first, the pixel portion 1311 will be described.

The pixel portion 1311 is a region where an image display is carried out, and includes a plurality of pixels. A TFT (hereinafter referred to as a current control TFT) 1302 for controlling a current flowing through an organic EL element, a pixel electrode (anode) 1301, an organic EL layer 1304 and a cathode 1305 are provided for each of the pixels. Incidentally, although only the current control TFT is shown in FIG. 13, a TFT (hereinafter referred to as a switching TFT) for controlling a voltage applied to a gate of the current control TFT is provided.

As the current control TFT 1302, it is preferable to use a p-channel TFT here. Although an n-channel TFT can also be used, in the case where the current control TFT is connected to an anode of the organic EL element as in the structure of FIG. 13, the p-channel TFT can suppress power consumption more effectively. However, as the switching TFT, any of an n-channel TFT and a p-channel TFT may be used.

A pixel electrode 1303 is electrically connected to a drain of the current control TFT 1302. Here, since a conductive material having a work function of 4.5 to 5.5 eV is used as a material of the pixel electrode 1303, the pixel electrode 1303 functions as an anode of the organic EL element. As the pixel electrode 1303, typically, indium oxide, tin oxide, zinc oxide, or a compound of these (such as ITO) may be used. An organic EL layer 1304 is provided on the pixel electrode 1303.

Next, a cathode 1305 is provided on the organic EL layer 1304. A conductive material having a work function of 2.5 to 3.5 eV is used as a material of the cathode 1305. As the cathode 1305, typically, a conductive film containing an element in alkaline metals or alkali earth metals or a laminate of the former and aluminum alloy may be used.

The layer constituted by the pixel electrode 1303, the organic EL layer 1304, and the cathode 1305 is covered with a protection film 1306. The protection film 1306 is provided to protect the EL element against oxygen and water. As a material of the protection film 1306, a silicon nitride film, a silicon nitride oxide film, an aluminum oxide film, a tantalum oxide film, or a carbon film (specifically a diamond-like carbon film) is used.

Next, the driving circuit 1312 will be described. The driving circuit 13 is a region where timings of signals (gate signals and data signals) transmitted to the pixel portion 1311 are controlled, and a shift register, a buffer, a latch, an analog switch (transfer gate), or a level shifter is provided. Here, a CMOS circuit formed of an n-channel TFT 1307 and a p-channel TFT 1300 is shown as a basic unit of these circuits in FIG. 13.

Incidentally, the circuit structure of the shift register, buffer, latch, analog switch (transfer gate) or level shifter may be a well-known one. In FIG. 13, although the pixel portion 1311 and the driving circuit 1312 are provided on the same substrate, it is also possible to electrically connect an IC or LSI without providing the driving circuit 1312.

Here, in FIG. 13, although the pixel electrode (anode) 1303 is electrically connected to the current control TFT 1302, a structure can also be adopted in which a cathode of the EL element is electrically connected to the current control TFT. In that case, it is appropriate that the pixel electrode is formed of the same material as the cathode 1305, and the cathode is formed of the same material as the pixel electrode 1303. In that case, it is preferable that the current control TFT is made an n-channel TFT.

Figure 14A:
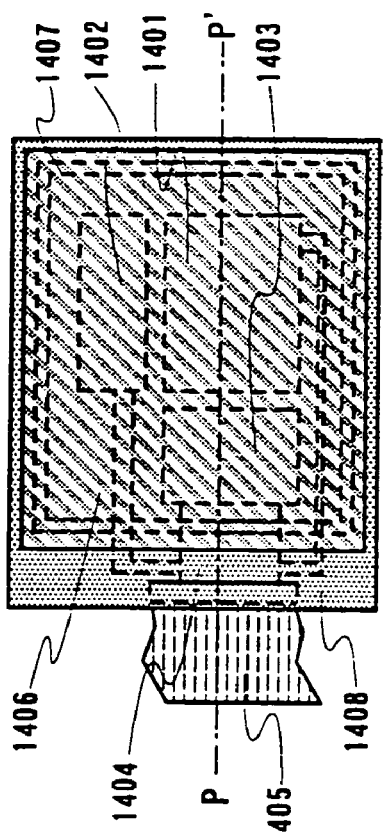
FIGS. 14A and 14B show a top surface structure and a cross sectional structure of the light emitting device.
Figure 14B:
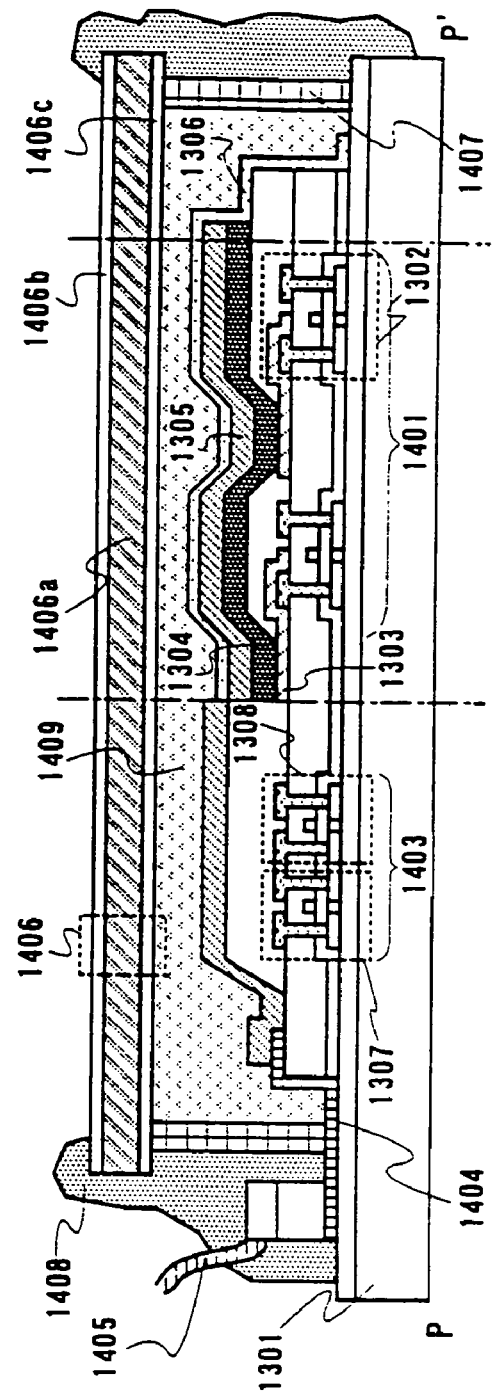

Here, external appearance views of the active matrix type light emitting device shown in FIG. 13 are shown in FIGS. 14A and 14B. FIG. 14A is a top view and FIG. 14B is a sectional view taken along P–P' of FIG. 14A. Besides, symbols of FIG. 13 are used.

In FIG. 14A, reference numeral 1401 designates a pixel portion, 1402, a gate signal side driving circuit; and 1403, a data signal side driving circuit. Signals transmitted to the gate signal side driving, circuit 1402 and the data signal side driving circuit 1403 are inputted through an input wiring line 1404 from a TAB (Tape Automated Bonding) tape 1405. Incidentally, although not shown, instead of the TAB tape 1405, a TCP (Tape Carrier Package) in which an IC (Integrated Circuit) is provided on a TAB tape may be connected.

At this time, reference numeral 1406 designates a cover member provided over the organic EL element shown in FIG. 13, and is bonded through a sealing member 1407 made of resin. As the cover member 1406, any material may be used as long as oxygen and water does not permeate through it. Here, as shown in FIG. 14B, the cover member 1406 is formed of a plastic member 1406a and carbon films (specifically, diamond-like carbon films) 1406b and 1406c provided on the outside surface and the inside surface of the plastic member 1406a.

Further, as shown in FIG. 14B, the seal member 1407 is covered with a sealing member 1408 made of resin, and the organic EL element is completely sealed in an airtight space 1409. At this time, the airtight space 1409 may be filled with an inert gas (typically, a nitrogen gas or a rare gas), a resin, or an inert liquid (typically, liquid carbon fluoride typified by perfluoroalkane). Further, it is also effective to provide a moisture absorbent or a deoxidation agent.

Besides, a polarizing plate may be provided on a display surface (surface on which an image is observed) of the light emitting device shown in this embodiment. This polarizing plate has an effect to suppress reflection of light incident from the outside, and to prevent an observer from being reflected on the display surface. In general, a circular polarization plate is used. However, in order to prevent light emitted from the organic EL film from being returned to the inside through reflection by the polarizing plate, it is desirable to form a structure having low inner reflection by adjusting refractivity.

Incidentally, for the organic EL element included in the light emitting device of this embodiment, any of the organic EL element of the present invention may be used.

Embodiment 9

Figure 15A:
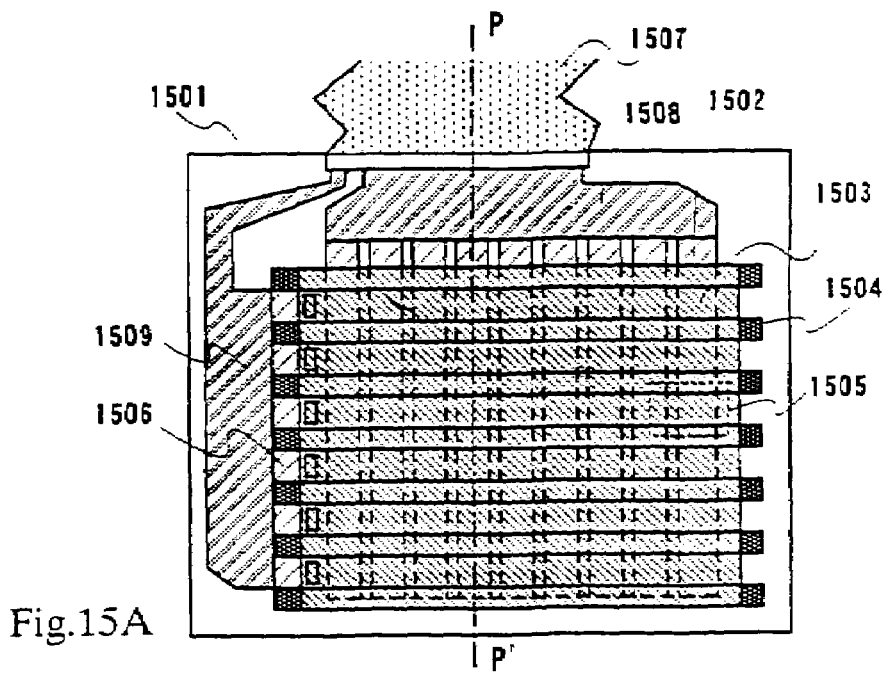
FIGS. 15A to 15C show a top surface structure and cross sectional structures of the light emitting device.
Figure 15B:
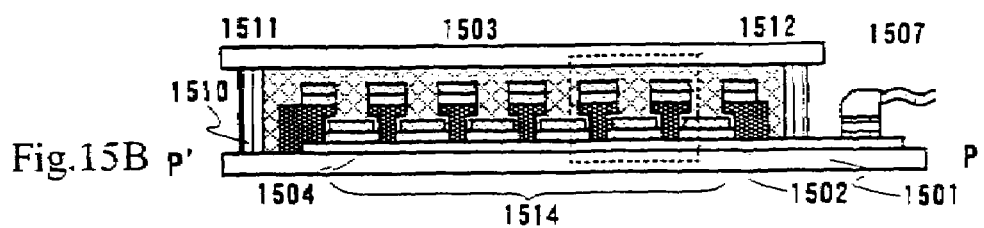

In this embodiment, as a example of the light emitting device including an organic EL element of the present invention, passive matrix type light emitting device will be described. FIG. 15A is a top view and FIG. 15B is a sectional view taken along P–P' of FIG. 15A.

In FIG. 15A, reference numeral 1501 designates a substrate, and here, a plastic material is used. As the plastic material, polyimide, polyamide, acryl resin, epoxy resin, PES (polyethylene sulfile), PC (polycarbonate), PET (polyethylene terephthalate), or PEN (polyethylene naphthalate) is shaped into a plate or a film and is used.

Reference numeral 1502 designates a scanning line (anode) made of an oxide conductive film, and in this embodiment, an oxide conductive film of zinc oxide, to which gallium oxide is added, is used. Reference numeral 1503 designates a data line (cathode) made of a metal film and a bismuth film is used in this embodiment. Reference numeral 1504 designates a bank made of acryl resin, and functions as a partition wall for dividing the data line 1503. A plurality of scanning lines 1502 and data lines 1503 are formed to have a stripe shape, and are provided to intersect with each other at right angles. Although not shown in FIG. 15A, an organic EL layer is interposed between the scanning line 1502 and the data line 1503, and an intersection portion designated by 1505 becomes a pixel.

The scanning, line 1502 and the data line 1503 are connected to an external driving circuit through a TAB tape 1507. Reference numeral 1508 designates a wiring group in which the scanning lines 1502 are collected, and 1509 designates a wiring group made of a collection or connection wiring lines 1506 connected to the data lines 1503. Although not shown, instead of the TAB tape 1507, a TCP in which an IC is provided on a TAB tape may be connected.

Besides, in FIG. 15B, reference numeral 1510 designates a seal member: and 1511, a cover member bonded to the plastic member 1501 by the seal member 1510. As the seal member 1510, a photo-curing resin may be used, and a material with little degassing and low moisture sorption is desirable. As the cover member, the same material as the substrate 1501 is desirable, and glass (including quartz glass) or plastic can be used. Here, a plastic member is used.

Figure 15C:
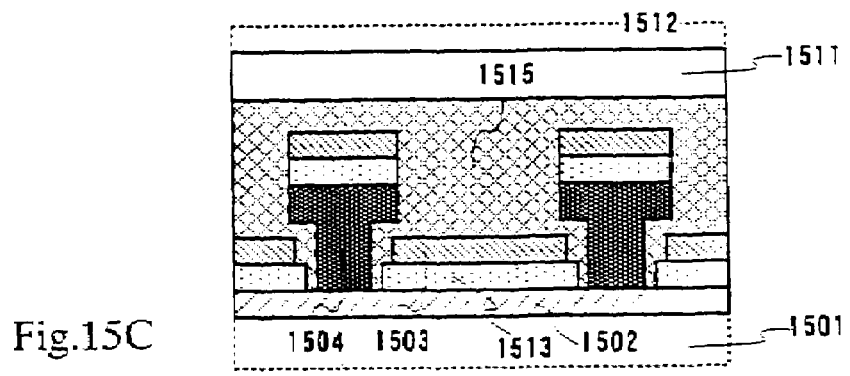

FIG. 15C is an enlarged view of a structure of a pixel region 1512. Reference numeral 1513 designates an organic EL layer. Incidentally, as shown in FIG. 15C, the bank 1504 has such a shape that the width of a lower layer is narrower than the width of an upper layer, and physically divides the data line 1503. A pixel portion 1514 surrounded by the seal member 1510 is cut off from the outer air by a sealing member 1515 made of resin and has a structure of preventing deterioration of the organic EL layer.

Since the pixel portion 1514 is formed of the scanning lines 1502, the data lines 1503, the banks 1504, and the organic EL layers 1513, the light emitting device of the present invention including, the structure as described above can be fabricated by a very simple process.

Besides, a polarizing plate may be provided on a display surface (surface on which an image is observed) of the light emitting device shown in this embodiment. This polarizing plate suppresses reflection of light incident from the outside, and has an effect of preventing an observer from being, reflected on the display surface. In general, a circular polarization plate is used. However, in order to prevent light emitted from the organic EL film from being returned to the inside through reflection by the polarizing plate, it is desirable to make a structure have low inner reflection by adjusting refractivity.

Incidentally, for the organic EL element included in the light emitting device of this embodiment, any of the organic EL element of the present invention may be used.

Embodiment 10

In this embodiment, there is a description of an example in which a printed wiring board is provided with the light emitting device shown in the embodiment 8 to form a module.

Figure 16A:
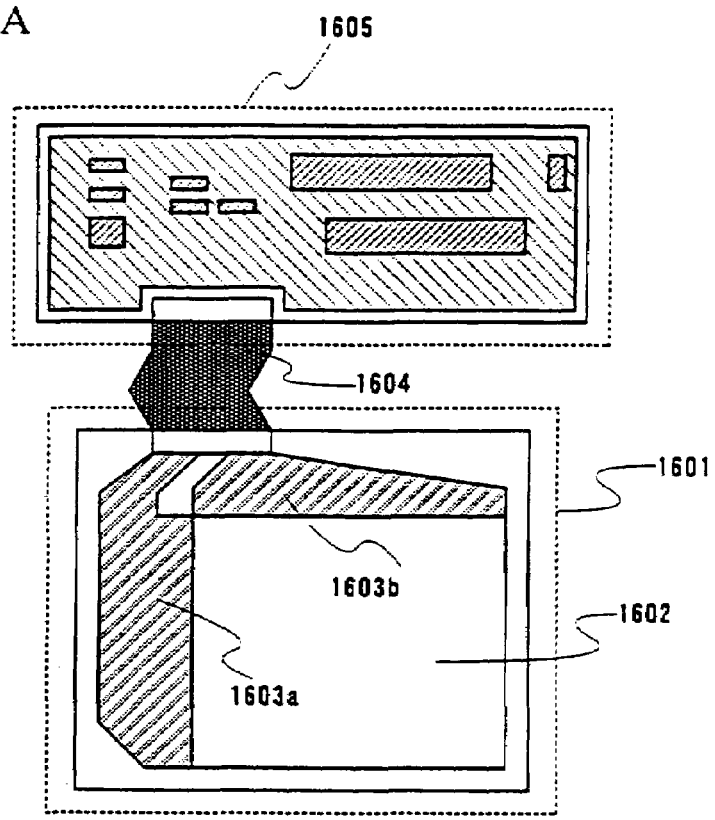
FIGS. 16A and 16B show structures of the light emitting device.

In a module shown in FIG. 16A, a TAB tape 1604 is attached to a substrate 1601 (including a pixel portion 1602 and wiring lines 1603a and 1603b) and a printed wiring board 1605 is attached through the TAB tape 1604.

Figure 16B:
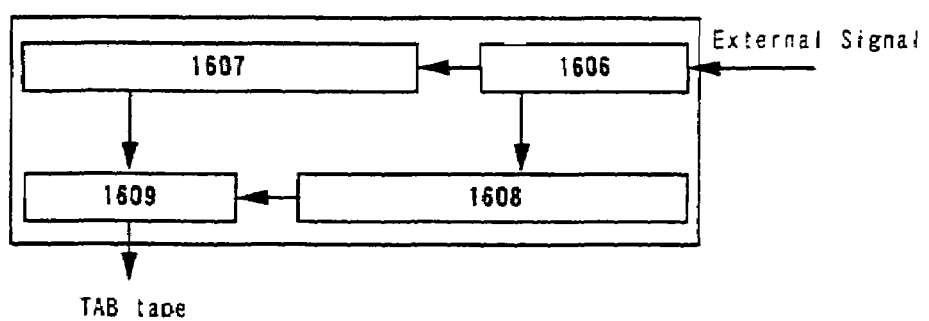

Here, FIG. 16B is a functional block diagram of the printed wiring board 1605. Inside the printed wiring board 1605, at least I/O ports (also called input or output portion) 1606 and 1609 and an IC functioning as a data signal side driving circuit 1607 and a gate signal side driving circuit 1608 are provided inside the printed wiring board 1605.

The module with the structure, in which the TAB tape is attached to the substrate which has the substrate surface on which the pixel portion is formed and the printed wiring board which has a function as a driving circuit is attached through the TAB tape, is especially called a module with an external driving circuit in the present specification.

Incidentally, as the organic EL element included in the light emitting device of this embodiment, any of the organic EL element of the present invention must be used.

Embodiment 11

In this embodiment, a description of an example in which a printed wiring board is provided with the light emitting device shown in the embodiment 8 or the embodiment 9 to form a module.

Figure 17A:
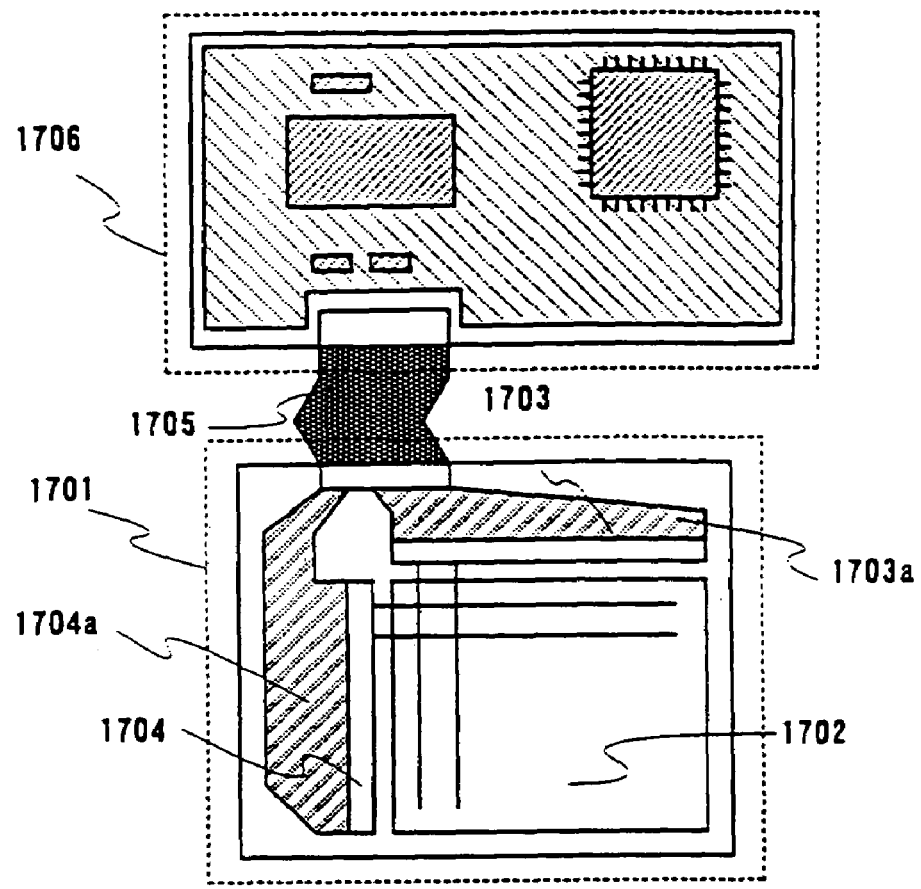
FIGS. 17A and 17B show structures of the light emitting device.

In a module shown in FIG. 17A, a TAB tape 1705 is attached to a substrate 1701 (including a pixel portion 1702, a data signal side driving circuit 1703, a gate signal side driving circuit 1704, and wiring lines 1703a and 1704a) and a printed wiring board 1706 is attached through the TAB tape 1705. Here, FIG. 17B is a functional block diagram of the printed wiring board 1706.

Figure 17B:
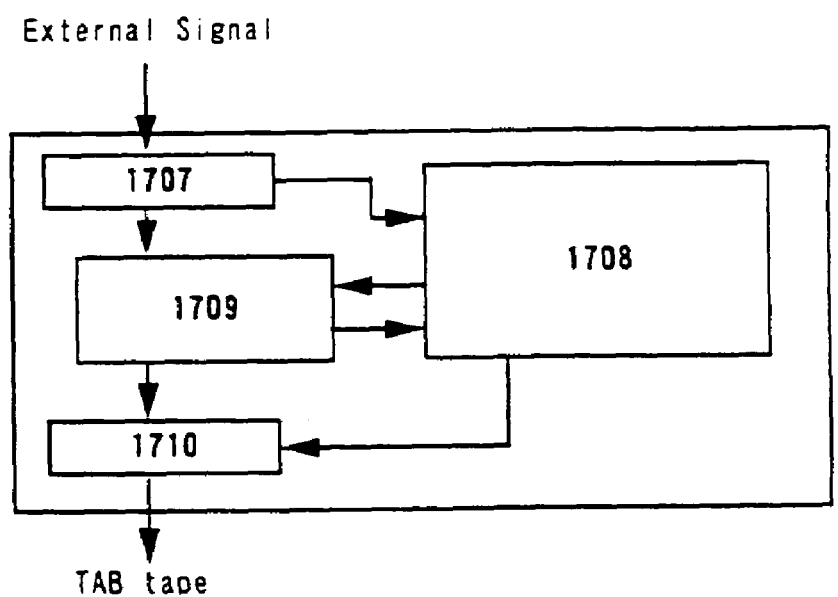

As shown in FIG. 17B, at least I/O ports 1707 and 1710, and an IC functioning as a control portion 1708 are provided inside the printed wiring board 1706. Incidentally, although a memory portion 1709 is provided here, it is not necessarily required. Besides, the control portion 1708 is a portion which has a function to control management of a driving circuit, correction or picture data, and the like.

The module of the structure in which the printed wiring board with the function as a controller is attached to the substrate over which the organic EL element is formed, is especially called a module with an external controller in the present specification.

Incidentally, as the organic EL element included in the light emitting device of this embodiment, any of the organic EL element of the present invention may be used.

Embodiment 12

The light emitting device of the present invention, which is described in the above embodiment has advantages being bright and having low consumption power. Thus, an electronic device including the light emitting device as a display device or the like can be operated with lower consumption power than a conventional appliance. In particular, electronic equipment such as a mobile equipment in which a batters is used as a power source is extremely effective. Because the low consumption power directly leads convenience (no battery state is hard to cause).

Since the light emitting device is a self light emission type, a back light in a liquid crystal display device is not required. Also, since a thickness of the organic EL film does not exceed 1 μm, thinness and weight reduction are allowed. Thus, an electronic device including the light emitting device as a display device or the like is thinner and light in weight as compared with a conventional appliance. In particular, electronic equipment such as a mobile equipment is extremely effective, because thinness and light in weight directly leads convenience (light and compact in portage). Further, with respect to electronic equipment in general, there is no room for doubt that thinness (not bulk) is effective in view of transportation (mass transportation is allowed) and setting (savings of a space such as a room).

Also, since the light emitting device is a self light emission type, this light emitting device has higher visibility in a light place and a wider view angle, as compared with those of a liquid crystal display device. Therefore, an electronic device including the light emitting device as a display portion has a large merit in view of display visibility.

Therefore, the electric equipment using the light-emitting device of the present invention has the merit, in which there are low power consumption, a light thin type and a high visibility or the like. In addition, because the light-emitting device composed to promote the phosphorescence by using the conventional fluorochrome obtained at a low price, the electric equipment using the light-emitting device has also the merit of becoming lower price compared with existing products.

In this embodiment, an example of an electronic device including the light emitting device of the present invention as a display portion will be described. Concrete examples are shown in FIGS. 18A to 18F and 19A and 19B. As the organic EL element included in the electronic device of this embodiment, any metal complexes shown in the present invention may be used. Also, as a mode of the light emitting device included in the electronic device of this embodiment, any one of the modes shown in FIGS. 13 to 17A and 17B may be used.

FIG. 18A shows an organic EL display device including a cabinet 1801a, a support base 1802a, and a display portion 1803a. When a display in which the light emitting device of the present invention is used as the display portion 1803a is manufactured, a thin and lightweight display can be realized. Thus, transportation is easy and space saving at setting the display is allowed.

FIG. 18B shows a video camera including a main body 2802b, a display portion 1802b, a voice input portion 1803b, an operational switch 1804b, a battery 1805b, and an image receiving portion 1806b. When a video camera using the light emitting device of the present invention as the display portion 1802b is manufactured, a video camera having low consumption power and being lightweight can be realized. Thus, consumption of a battery is reduced and portage becomes easy.

FIG. 18C shows a digital camera including a main body 1801c, a display portion 1802c, an eyepiece portion 1803c, and an operational switch 1804c. When a digital camera using the light emitting device of the present invention as the display portion 1802c is manufactured, a digital camera having low consumption power and being lightweight can be realized. Thus, consumption of a battery is reduced and portage becomes easy.

FIG. 18D shows an image reproduction apparatus having a recording medium. The image reproduction apparatus includes a main body 1801d, a recording medium (CD, LD, DVD, or the like) 1802d, an operational switch 1803d, a display portion (A) 1804d, and a display portion (B) 1805d The display portion (A) 1804d displays mainly image information and the display portion (B) 1805d displays mainly character information. When the image reproduction apparatus using the light emitting device of the present invention as these display portions (A) 1804d and (B) 1005d is manufactured, an image reproduction apparatus having low consumption power and being lightweight can be realized. The image reproduction apparatus having the recording medium includes a CD reproduction apparatus, a game equipment, and the like.

FIG. 18E shows a portable (mobile) computer including a main body 1801e, a display portion 1802e, an image receiving portion 1803e, an operational switch 1804e, and a memory slot 1805e. When a portable computer using the light emitting device of the present invention as the display portion 1802e is manufactured, a portable computer having low consumption power, being thin, and lightweight can be realized. Thus, consumption of a battery is reduced and portage becomes easy. This portable computer can record information in a recording medium into which a flash memory and a non-volatile memory are integrated and reproduce the information.

FIG. 18F shows a personal computer including a main body 1801f, a cabinet 1802f, a display portion 1803f, and a keyboard 1804f. When a personal computer using the light emitting device of the present invention as the display portion 1803f is manufactured, a personal computer having low consumption power, being thin, and lightweight can be realized. In particular, when portage use is required as the case of a note personal computer, it is a large merit in view of consumption of a battery and lightness.

In many cases, the above electronic device displays information distributed through an electronic communication line such as Internet and a radio communication such as radio wave. In particular, the case where moving image information is displayed is increased. A response speed of the organic EL material is very high, and thus it is suitable for such moving image display.

Figure 19A:
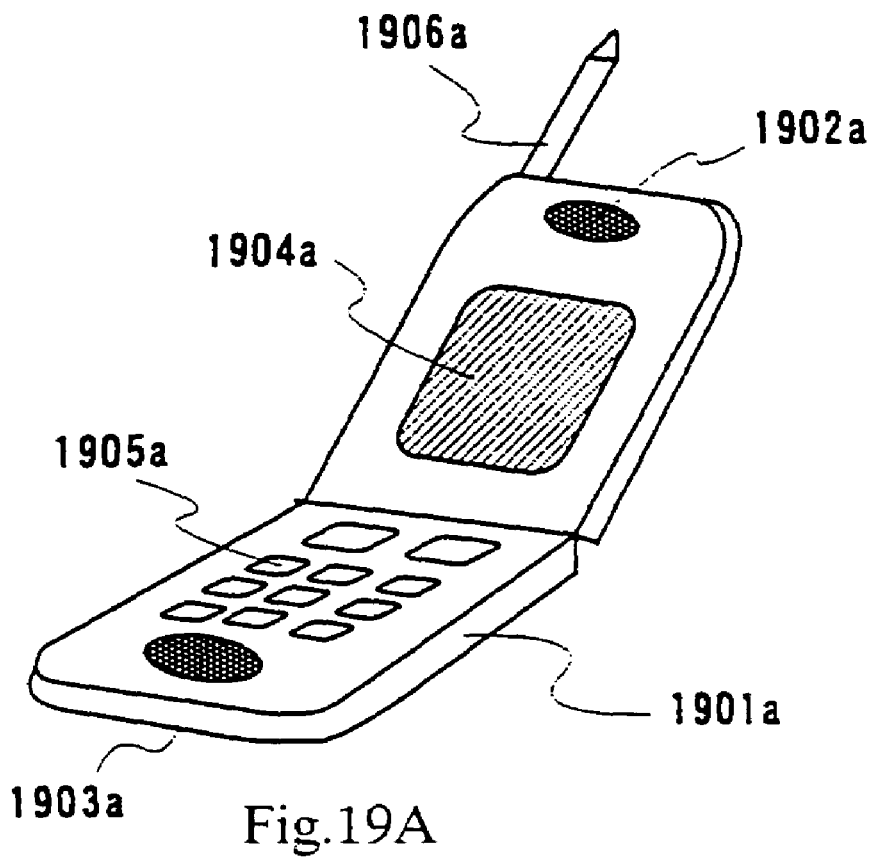
FIGS. 19A and 19B show concrete examples of the electrical appliance.

Next, FIG. 19A shows a mobile telephone including a main body 1901a, a voice output portion 1902a, a voice input portion 1903a, a display portion 1904a, an operational switch 1905a, and an antenna 1906a. When a mobile telephone using the light emitting device of the present invention as the display portion 1904a is manufactured, a mobile telephone having low consumption power, being thin, and lightweight can be realized. Thus, consumption of a battery is reduced, portage becomes easy, and the main body can be made compact.

Figure 19B:
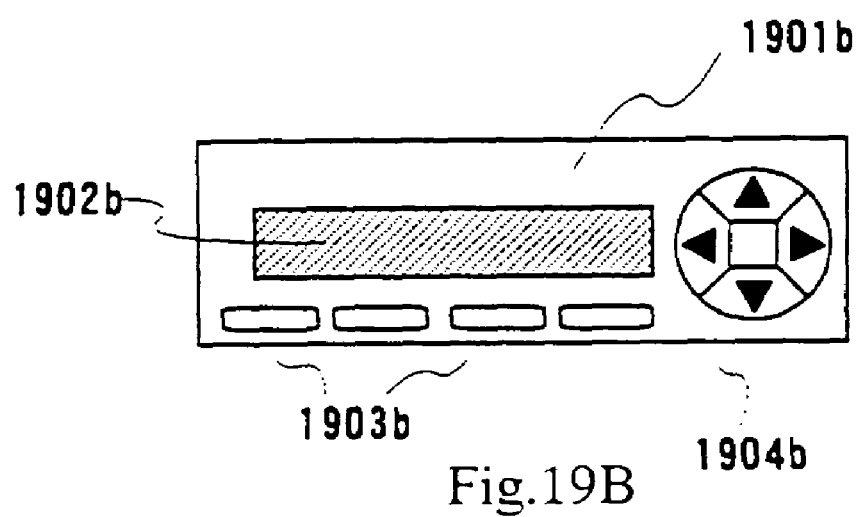

FIG. 19B shows an acoustic equipment (concretely, a vehicle setting audio) including a main body 1901b, a display portion 1902b, and operational switches 1903b and 1904b. When an acoustic equipment using the light emitting device of the present invention as the display portion 1902b is manufactured, an acoustic equipment having low consumption power and being light in weight can be realized. However, in this embodiment, the vehicle setting audio is described as an example. The light emitting device may be used for a home audio.

With respect to the electronic devices as shown in FIGS. 18A to 18F and 19A and 19B, it is effective that a photo sensor is incorporated and a means for detecting brightness in an environment for use is provided and thus a function such as a light emission intensity is modulated in accordance with the brightness in the environment for use is provided. If the intensity with a contrast ratio of 100 to 150 can be obtained as compared with the brightness in the environment for use, a user can recognize an image or character information without causing a problem. That is, when the environment for use is light, the intensity of the image can be increased such that it is easy to view. On the other hand, when the environment for use is dark, the intensity of the image can be reduced and thus consumption power can be suppressed.

Also, since an operation with low consumption power, thinness, and weight reduction are allowed, various electronic devices using the light emitting device of the present invention as a light source are very useful. Typically, with respect to the electronic device including the light emitting device of the present invention as a light source such as a back light or a front light of the liquid crystal display device or a light source of an illumination equipment, realization of low consumption power, thinness, and weight reduction is allowed.

Thus, even in the case where a liquid crystal display is used for all the display portions of the electronic devices which are described in this embodiment and shown in FIGS.

18A to 18F and 19A and 19B, when electronic device using the light emitting device of the present invention as the back light or the front light of the liquid crystal display is manufactured, electronic equipment having low consumption power, being thin, and light in weight can be achieved.

When the present invention is embodied, a light emitting device which is light; has low consumption power; indicates various light emission colors; and is low in cost, can be obtained. Further, an electrical appliance which is light, has low consumption power, indicates various light emission colors, and has a low cost, can be obtained by using such a light emitting device for a light source or a display portion.

What is claimed is:

1. A mobile equipment comprising a main body and a display portion attached to the main body, said display portion including a light emitting device comprising:
    an organic EL element that includes a light emitting layer comprising an electroluminescent organic compound and a metal complex,
    wherein the metal complex comprises a lattice structure in which metal atoms and ligands are alternately arranged, and
    the ligands are located in lattice points and the lattice points are cross-linked through the ligands in the lattice structure.

2. A mobile equipment comprising a main body and a display portion attached to the main body, said display portion including a light emitting device comprising:
    an organic EL element that includes a light emitting layer comprising an electroluminescent organic compound and a metal complex,
    wherein the metal complex comprises a lattice structure in which metal atoms and ligands are alternately arranged, and
    the metal atoms are located in lattice points and the lattice points are cross-linked through the metal atoms in the lattice structure.

3. The mobile equipment according to claim 1 wherein the metal atoms have atomic numbers equal to or larger than rubidium.

4. The mobile equipment according to claim 2 wherein the metal atoms have atomic numbers equal to or larger than rubidium.

5. A mobile equipment comprising a main body and a display portion attached to the main body, said display portion including a light emitting device comprising:
    an organic EL element having a light emitting layer that includes an electroluminescent organic compound and a metal complex with a dinuclear structure comprising two metal atoms as nuclei,
    wherein the metal complex comprises a lattice structure in which sites with the dinuclear structure and ligands are alternately arranged, and
    the sites with the dinuclear structure are located in lattice points and the lattice points are cross-linked through the ligands in the lattice structure.

6. A mobile equipment comprising a main body and a display portion attached to the main body, said display portion including a light emitting device comprising:
    an organic EL element having a light emitting layer that includes an electroluminescent organic compound and a metal complex with a dinuclear structure comprising two metal atoms as nuclei,
    wherein the metal complex comprises a lattice structure in which sites with the dinuclear structure and ligands are alternately arranged, and
    the ligands are located in lattice points and the lattice points are cross-linked through the sites with the dinuclear structure in the lattice structure.

7. The mobile equipment according to claim 5, wherein each of the metal atoms is one element selected from the group 5 to 11 elements of the periodic table.

8. The mobile equipment according to claim 6 wherein each of the metal atoms is one element selected from the group 5 to 11 elements of the periodic table.

9. A mobile equipment comprising a main body and a display portion attached to the main body, said display portion including a light emitting device comprising:
    an organic EL element having a light emitting layer that includes an electroluminescent organic compound and a metal complex with a dinuclear structure comprising two metal atoms as nuclei,
    wherein the metal complex comprises a divalent metal ion of one element selected from the group 5 to 11 elements of the period table and a ligand comprising a dicarboxylic ion.

10. A mobile equipment comprising a main body and a display portion attached to the main body, said display portion including a light emitting device comprising:
    an organic EL element having a light emitting layer that includes an electroluminescent organic compound and a metal complex with a dinuclear structure comprising two metal atoms as nuclei,
    wherein the metal complex comprises a divalent metal ion of one element selected from the group 5 to 11 elements of the period table and a ligand represented by the general formula,

[Chemical Formula 1]

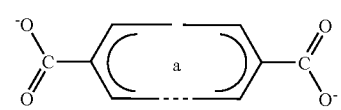

where a denotes one selected from the group consisting of a substituent comprising a paraphenylene group, a substituent comprising a heterocyclic ring, and a substituent comprising a condensed ring.

11. A mobile equipment comprising a main body and a display portion attached to the main body, said display portion including a light emitting device comprising:
    an organic EL element having a light emitting layer that includes an electroluminescent organic compound and a metal complex with a dinuclear structure comprising two metal atoms as nuclei,
    wherein the metal complex comprises a divalent metal ion of one element selected from the group 5 to 11 elements of the periodic table and a ligand represented by the general formula,

[Chemical Formula 2]

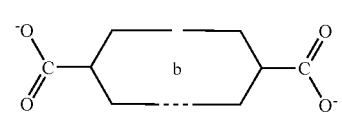

where b denotes at least one cycloalkylene group and the b may comprise a substituent.

12. A mobile equipment comprising a main body and a display portion attached to the main body, said display portion including a light emitting device comprising:

an organic EL element having a light emitting layer that includes an electroluminescent organic compound and a metal complex with a dinuclear structure comprising two metal atoms as nuclei, wherein the metal complex comprises a divalent metal ion of one element selected from the group 5 to 11 elements of the periodic table and a ligand represented by the general formula,

[Chemical Formula 3]

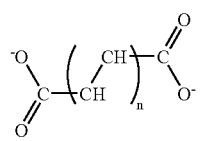

where n denotes an integer equal to or larger than 1.

13. A mobile equipment comprising a main body and a display portion attached to the main body, said display portion including a light emitting device comprising:

an organic EL element having a light emitting layer that includes an electroluminescent organic compound and a metal complex with a dinuclear structure comprising two metal atoms as nuclei, wherein the metal complex comprises a divalent metal ion of one element selected from the group 5 to 11 elements of the periodic table and a ligand represented by the general formula,

[Chemical Formula 4]

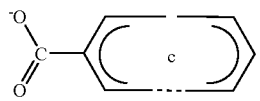

where c denotes one selected from the group consisting of a substituent comprising an aryl group, a substituent comprising a heterocyclic ring, and a substituent comprising a condensed ring.

14. The mobile equipment according to claim 1 further comprising an anode and a cathode, wherein said light emitting layer is interposed between said anode and said cathode.

15. The mobile equipment according to claim 5 further comprising an anode and a cathode, wherein said light emitting layer is interposed between said anode and said cathode.

16. The mobile equipment according to claim 9 further comprising an anode and a cathode, wherein said light emitting layer is interposed between said anode and said cathode.

17. The mobile equipment according to claim 10 further comprising an anode and a cathode, wherein said light emitting layer is interposed between said anode and said cathode.

18. The mobile equipment according to claim 1 wherein the mobile equipment is at least one selected from the group consisting of an organic EL display device, a video camera, a digital camera, an image reproduction apparatus, a mobile computer, a personal computer and an acoustic equipment.

19. The mobile equipment according to claim 2 wherein the mobile equipment is at least one selected from the group consisting of an organic EL display device, a video camera, a digital camera, an image reproduction apparatus, a mobile computer, a personal computer and an acoustic equipment.

20. The mobile equipment according to claim 5 wherein the mobile equipment is at least one selected from the group consisting of an organic EL display device, a video camera, a digital camera, an image reproduction apparatus, a mobile computer, a personal computer and an acoustic equipment.

21. The mobile equipment according to claim 6 wherein the mobile equipment is at least one selected from the group consisting of an organic EL display device, a video camera, a digital camera, an image reproduction apparatus, a mobile computer, a personal computer and an acoustic equipment.

22. The mobile equipment according to claim 9 wherein the mobile equipment is at least one selected from the group consisting of an organic EL display device, a video camera, a digital camera, an image reproduction apparatus, a mobile computer, a personal computer and an acoustic equipment.

23. The mobile equipment according to claim 10 wherein the mobile equipment is at least one selected from the group consisting of an organic EL display device, a video camera, a digital camera, an image reproduction apparatus, a mobile computer, a personal computer and an acoustic equipment.

24. The mobile equipment according to claim 11 wherein the mobile equipment is at least one selected from the group consisting of an organic EL display device, a video camera, a digital camera, an image reproduction apparatus, a mobile computer, a personal computer and an acoustic equipment.

25. The mobile equipment according to claim 12 wherein the mobile equipment is at least one selected from the group consisting of an organic EL display device, a video camera, a digital camera, an image reproduction apparatus, a mobile computer, a personal computer and an acoustic equipment.

26. The mobile equipment according to claim 13 wherein the mobile equipment is at least one selected from the group consisting of an organic EL display device, a video camera, a digital camera, an image reproduction apparatus, a mobile computer, a personal computer and an acoustic equipment.

* * * * *